(12) United States Patent
Petrin et al.

(10) Patent No.: US 10,807,685 B2
(45) Date of Patent: Oct. 20, 2020

(54) SELF ASSEMBLING FLOATING SOLAR PODS

(71) Applicants: Michael Petrin, Walnut Creek, CA (US); Peter Tormey, Concord, CA (US)

(72) Inventors: Michael Petrin, Walnut Creek, CA (US); Peter Tormey, Concord, CA (US)

(73) Assignee: Solarpods, Inc., Pleasant Hill, CA (US)

( * ) Notice: Subject to any disclaimer, the term of this patent is extended or adjusted under 35 U.S.C. 154(b) by 554 days.

(21) Appl. No.: 15/273,457

(22) Filed: Sep. 22, 2016

(65) Prior Publication Data

US 2017/0085213 A1 Mar. 23, 2017

Related U.S. Application Data

(60) Provisional application No. 62/222,735, filed on Sep. 23, 2015, provisional application No. 62/264,300, filed on Dec. 7, 2015.

(51) Int. Cl.
*H02S 40/36* (2014.01)
*H01L 31/02* (2006.01)
(Continued)

(52) U.S. Cl.
CPC .............. *B63B 35/44* (2013.01); *B63B 35/38* (2013.01); *H01L 31/02021* (2013.01);
(Continued)

(58) Field of Classification Search
None
See application file for complete search history.

(56) References Cited

U.S. PATENT DOCUMENTS 3,984,881 A * 10/1976 Gerlach .................... E04H 4/08
126/565
4,786,795 A * 11/1988 Kurashima ............. G01S 3/7861
250/203.4
(Continued)

FOREIGN PATENT DOCUMENTS

CN 104506131 A * 4/2015
WO WO-2010100291 A1 * 9/2010 ............. E04H 4/082

OTHER PUBLICATIONS

Pauley, SOlar-Marine Power Generators, Oct. 28, 2011, www.trendhunter.com/trends/marine-solar-cells, accessed Sep. 28, 2015 (Year: 2011).*
(Continued)

*Primary Examiner* — Shannon M Gardner
(74) *Attorney, Agent, or Firm* — Antero Tormey Petrin; Michael J Petrin; Peter J Tormey

(57) ABSTRACT

Devices and methods with a radiant energy convertors on a flotation module operable to dispose the radiant energy convertor in a first direction. A plurality of magnetic connector elements is disposed near one or a plurality of sides of the flotation module and each magnetic connector element is coupled to the radiant energy convertor, wherein said magnetic connector elements operate to magnetically attract and physically couple one or a plurality of adjacent flotation modules and electrically couple a set of electrodes that operate to connect to an adjacent magnetic connector element located on a second similar adjacent flotation module when at least two magnetic connector elements are located in proximity to one another thereby providing a power grid of floating solar power modules.

10 Claims, 15 Drawing Sheets

(51) Int. Cl.
*H01L 31/054* (2014.01)
*H02S 40/38* (2014.01)
*B63B 35/38* (2006.01)
*B63B 35/44* (2006.01)

(52) U.S. Cl.
CPC .......... *H01L 31/0543* (2014.12); *H02S 40/36* (2014.12); *H02S 40/38* (2014.12); *B63B 2035/4453* (2013.01); *Y02E 10/52* (2013.01)

(56) References Cited

U.S. PATENT DOCUMENTS

| | | | |
|---|---|---|---|
| 7,093,593 B2* | 8/2006 | Rosene | F24S 10/17 |
| | | | 126/565 |
| 2005/0045224 A1* | 3/2005 | Lyden | H02J 7/355 |
| | | | 136/252 |
| 2009/0178709 A1* | 7/2009 | Huber | H01L 24/95 |
| | | | 136/258 |
| 2013/0118550 A1* | 5/2013 | Sahin | H01L 31/042 |
| | | | 136/246 |

OTHER PUBLICATIONS

Pauley, flating webs capture sun and wave power, Nov. 17, 2011, news.discovery.com/tech/marine-solar-cells-wave-solar-energy-111117.htm, accessed Sep. 28, 2015 (Year: 2011).*
Machine translation CN 104506131, accessed Feb. 3, 2020 (Year: 2020).*

* cited by examiner

SELF ASSEMBLING FLOATING SOLAR PODS

PRIORITY

This application claims the benefit of provisional patent applications 62/222,735 (filed Sep. 23, 2016) and 62/264,300 (filed Dec. 7, 2016), both by the same inventors. Applications 62/222,735 and 62/264,300 are incorporated by reference as if fully set forth herein.

BACKGROUND

The present disclosure relates generally to floating solar collector pods that can be introduced onto the surface of a body of water and operate to automatically connect to one another proximate pods forming a reversible self-assembled physically and electrically coupled array of floating pods that operate to harvest incident solar radiation and also operate to reduce the degree of evaporative water loss from the body of water.

SUMMARY

Disclosed herein is a device with a radiant energy convertor on a flotation module operable to dispose the radiant energy convertor in a first direction. A plurality of magnetic connector elements is disposed near one or a plurality of sides of the flotation module and each magnetic connector element is coupled to the radiant energy convertor, wherein said magnetic connector elements operate to magnetically attract and physically couple one or a plurality of adjacent flotation modules and electrically couple a set of electrodes that operate to connect to an adjacent magnetic connector element located on a second similar adjacent flotation module when at least two magnetic connector elements are located in proximity to one another thereby providing a power grid of floating solar power modules.

Also disclosed herein is a method of harvesting solar energy using an array of interconnected devices wherein said devices which include radiant energy convertors, flotation modules, magnetic connector elements disposed near one or a plurality of sides of the flotation module and each electrically coupled to the radiant energy convertor so that the magnetic connector elements operate to magnetically attract and physically couple one or a plurality of similar adjacent flotation modules and connect their electrodes so the harvested solar energy is stored within each device, or within said array, or communicated to an energy storage module, or combinations thereof.

DESCRIPTION

Representative Embodiments

Figure 1:
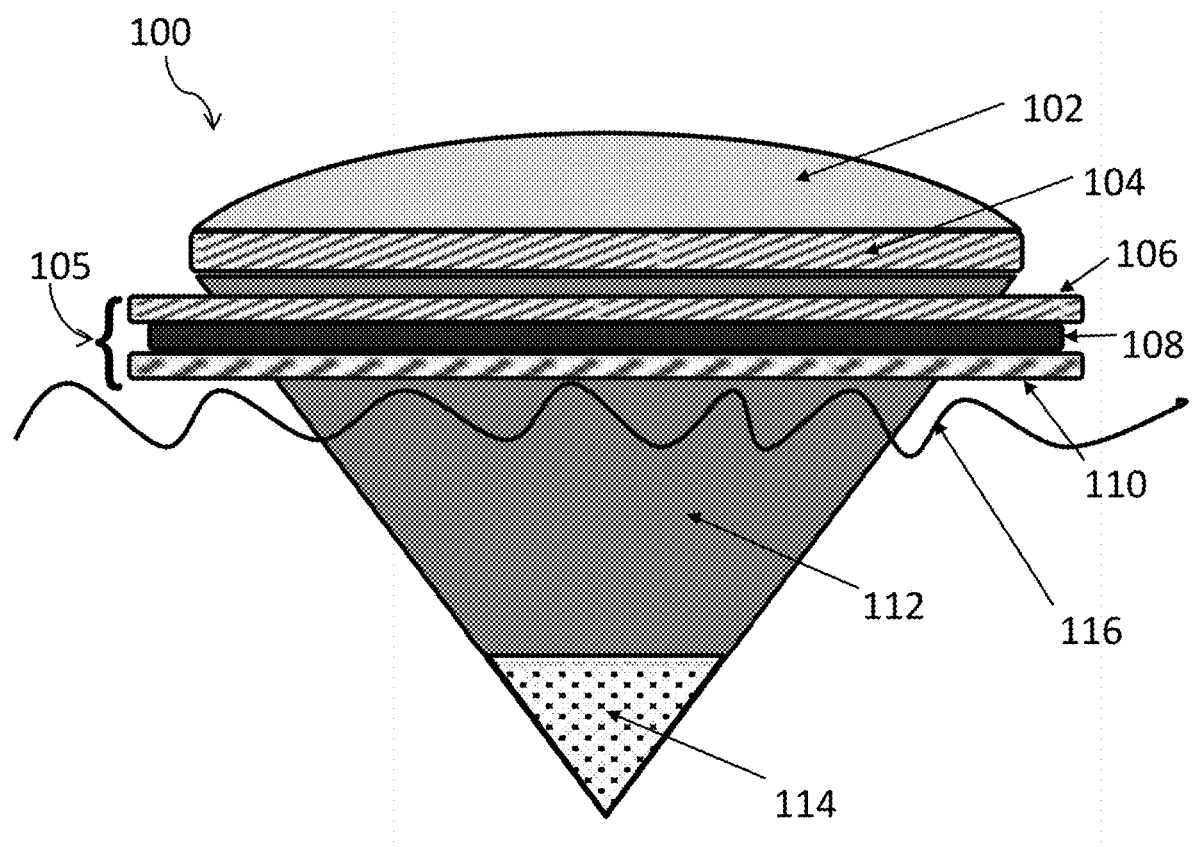
FIG. 1 shows a side view of one embodiment of a solar collector pod that floats upright in the water and has means to physically and electronically connect to adjacent pods and transmit electrical energy.

The embodiments described herein are merely representative embodiments showing the manufacture or use of the technologies described throughout this disclosure. The invention should be read in light of the claims and the totality of this disclosure and not limited by any particular embodiment.

In one embodiment of the present disclosure, an electrical energy generating pod is disclosed that features a radiant energy convertor such as a solar energy conversion module, a buoyant floatation module, a physical coupling module, and an electrical coupling module, and optionally a solar concentration module.

In a related embodiments of the present disclosure, an electrical energy generating pod is disclosed that features a solar energy conversion module, a buoyant floatation module, at least one physical coupling module, and at least one electrical coupling module, optionally in combination with at least one or more additional electronic modules selected from an electronic control module, an electronic communications module, a power coupling module, a power receiving module and a power storage module, and combinations thereof.

In one embodiment of the present disclosure, an electrical energy generating pod is disclosed that features a solar energy conversion module containing one or a plurality of a radiant energy conversion elements selected from, but not limited to, a solar panel, a thermoelectric module, a thermionic module, a thermopile, a solar battery, a solar cell, an optoelectronic cell, a photoelectric cell, a photovoltaic cell, and/or a combination thereof, and the like, wherein said energy conversion module is positioned on and optionally, reversible mounted onto, the upper surface of a buoyant floatation module that operates to maintain the floating pod in a substantially upright position with the latitudinal axis of the floating pod being maintained approximately normal to the surface of a body of water in which the floating pod is located.

In a further embodiment of the present disclosure, the solar energy conversion module features a radiant energy conversion element selected from, but not limited to, an amorphous silicon solar cell (a-Si), biohybrid solar cell, buried contact solar cell, cadmium telluride solar cell (CdTe), concentrated PV cell (CVP and HCVP), copper indium gallium selenide solar cells (CI[G]S), crystalline silicon solar cell (c-Si), dye-sensitized solar cell (DSSC), gallium arsenide germanium solar cell (GaAs), hybrid solar cell, luminescent solar concentrator cell (LSC), micromorphic (tandem-cell using a-Si/µc-Si), monocrystalline solar cell (mono-Si), multi junction solar cell (MJ), nanocrystal solar cell, organic solar cell (OPV), perovskite solar cell, photoelectrochemical cell (PEC), plasmonic solar cell, plastic solar cell, polycrystalline solar cell (multi-Si), polymer solar cell, quantum dot solar cell, solid-state solar cell, thin-film solar cell (TFSC), wafer solar cell, and the like. Certain embodiments may include combinations of solar conversion modules.

In yet a further embodiment of the present disclosure, an electrical energy generating pod is disclosed that features a solar energy conversion module coupled to a buoyant floatation module by means of a connection module, wherein the connection module has two interlocking elements, a first interlocking element physically attached to and/or integrated with at least one surface of the solar energy conversion module and a second interlocking element physically attached to and/or integrated with at least one surface of the buoyant floatation module, wherein the first and second interlocking elements operate to reversibly connect to one another forming a secure, but manually reversible, physical connection that serves to hold the solar energy conversion module and the buoyant floatation module in a fixed position and/or fixed alignment with respect to each of said module's center axis or rotation, with respect to each other.

In a related embodiment of the present disclosure, an electrical energy generating pod is disclosed that features a solar energy conversion module coupled to a buoyant floatation module by means of a connection module, wherein the connection module has two interlocking elements, a first interlocking element physically attached to and/or integrated with at least one portion of a lower or downward facing surface of the solar energy conversion module and a second interlocking element physically attached to and/or integrated with at least one portion of the an upper or upward facing surface of the buoyant floatation module.

In another related embodiment of the present disclosure, an electrical energy generating pod is disclosed that features a solar energy conversion module coupled to a buoyant floatation module by means of a connection module, wherein the connection module has at least two interlocking elements selected from, but not limited to, one or a plurality of an interlocking set of tangs and grooves, hook and loop fasteners, magnetic coupling elements, magnets, pins and pin receiving ports, screws and tapped screw receiving holes, reversible adhesive elements, physical coupling elements including hinge and pins, dowels, springs, and the like, and combinations thereof, wherein a first of said at least two interlocking elements is physically attached to and/or integrated with at least one portion of the solar energy conversion module, and wherein the second of said at least two interlocking elements is physically attached to and/or integrated with at least one portion of the buoyant floatation module, wherein the first and second interlocking elements of said connection module may be connected together to form a secure but reversible physical connection between the said first and second interlocking elements, thus operating to secure at least two equipment components selected from a solar energy conversion module and a buoyant floatation module together, wherein one of said equipment components is fixedly attached to the first interlocking element and the second of said equipment components is fixedly attached to the second interlocking element of said connection module.

In a further embodiment of the present disclosure, an electrical energy generating pod is disclosed that features a radiant energy conversion element combined with a solar concentration module, such as but not limited to one or a plurality of a mirror, a lens, a Fresnel collector, a diffraction grating, a prism, one or a plurality of fiber optic modules, combinations thereof, and the like, that operate to focus and concentrate incident solar radiation onto at least one operative surface of the radiant energy conversion element.

In a related embodiment of the present disclosure, an electrical energy generating pod is disclosed that features a buoyant floatation module having one or a plurality of wave abatement elements, such as but not limited to baffles, fins, blades, ballast modules, counterweights, flow channels, grooves, flaps, propellers, wings and combinations thereof, and the like, which operate to reduce the rocking and rotation of the floating pod induced by waves, wind and currents at or near the surface of the water with respect to the surface of the body of water in which the floating pod is located.

In another embodiment of the present disclosure, an electrical energy generating pod is disclosed that features a solar energy conversion module, a buoyant floatation module, and an inter-pod physical coupling system wherein the physical coupling system operates to guide two or a plurality of floating pods into a first alignment position and then into a second coupled position in which at least one first side of a first floating pod is held in close alignment and physically proximate to at least one second side of a second floating pod.

In a related embodiment of the present disclosure, the inter-pod physical coupling system operates to guide two or a plurality of floating pods into a first alignment position and then into a second coupled position in which at least one first side of a first floating pod is held in close alignment and physically proximate to at least one second side of a second floating pod, wherein the physical coupling system features a magnetic alignment unit which comprises a pivoting means, one or more pivot bearing elements, a pivot rod, a magnet capable of rotating around the pivot rod longitudinal axis, and optionally a dampening element.

In another related embodiment of the present disclosure, the physical coupling system further includes a magnetic coupling unit which comprises one or more support yokes that support a pivoting means, optionally a magnetic spacer element that operates to prevent two adjacent magnets from coming into direct physical contact with one another, and optionally a magnetic keeper plate that operates to maintain the magnetic charge of the magnet.

In a related embodiment of the present disclosure, the magnetic keeper plate is attached to an electromagnet module that can be activated to temporarily magnetize the magnetic keeper plate in order to align the rotating magnet into a desired position, and by means of temporarily magnetizing the two respective magnetic keeper plates of two adjacent and attached physical coupling modules with the same polarity, then operates to turn the two respective magnets so as to repel one another, which then results in the decoupling of the two previously connected physical coupling modules owing to magnetic repulsive forces, and which then further operates to prevent the two selected physical coupling modules from re-connecting as long as the repulsive alignment of the magnets is maintained by the two respective electromagnet modules.

In yet another embodiment of the present disclosure, an electrical energy generating pod is disclosed that has one or more inter-pod electrical coupling modules that operate to electrically connect a pod to one or more adjacent pods to which the pod is physically connected, wherein the electrical coupling module comprises an inter-pod electronic connection unit that features an inter-pod physical coupling module, and one or more electrical contact elements providing at least on positive contact and one negative contact, and optionally an electrical contact spring tension element located on or proximate to the anterior (non-contact side of the electrical contact element) that operates to apply an outward directed (with respect to the exterior or contact side of the electrical contact element) tension or spring force to the electrical contact element so that any two physically connected pods connected to one another will have their respective electrical contact elements tensioned against one another in a contact side to contact side configuration establishing an improved electrical connection.

In a related embodiment of the present disclosure, the electrical contact spring tension element is a spring of sufficient length to elevate the electrical contact element to some extent beyond the surface of the magnetic spacer element to which it is attached by means of the spring tension element, which operates to provide some translational, rotational and directional freedom of movement and positional displacement of the electrical contact element so that it can remain in electrical contact with an adjacent second electrical contact element to which it is attached by means of the electrical coupling module.

In yet another related embodiment of the present disclosure, the electrical coupling module and the physical coupling module are combined into one unit to provide an physical/electrical coupling module that operates to first align, then secondly, physically but reversibly and magnetically connect two adjacent pods to each other, each pod bearing at least one of a physical/electrical coupling module, and then thirdly to establish and maintain an electrical connection between the respective electrical contact elements of the respective pods during operation, despite relative movement and displacement of the pods owing to wave, wind and currents operating on them while floating on the surface of a body of water.

In another embodiment of the present disclosure, the electrical energy generating pod features an electronic control module, optionally programmable, having a circuit that operates to regulate the electrical output of the solar energy conversion module, (optionally) control charging of onboard energy storage device, which includes but is not limited to a capacitor and a rechargeable battery, or combination thereof, and the like being capable of storing electrically energy.

In a related embodiment of the present disclosure, the electronic control module operates to monitor the electrical status of the radiant energy conversion element and the onboard energy storage device and provides a signal to the user or to the power coupling unit wherein the signal operates to indicate the current circuit status, charging status, battery or energy storage status and related system parameters.

In a further embodiment of the present disclosure, the electrical energy generating pod features an electronic communications module, optionally programmable, having a circuit that that operates to store and use a current set of system operating parameters to set the current operating parameters of the electronic control module, optionally to transmit at least one informational signal to the user or to the electronic control module communicating system operating parameters, wherein selected operating parameters include, but are not limited to voltage and current output of energy conversion module, charging state of onboard energy storage device, number of electronically coupled adjacent pods, connection status of plurality of electrical contact elements (whether connected, negative or positive charge at contact), voltage and current status of electrical contact elements.

In yet a further embodiment of the present disclosure, the electrical energy generating pod features an electronic communications module, optionally programmable, having a circuit that that operates to receive an informational signal from user communicating a new and/or updated set of system operating parameters and then operates to update the electronic control module with new and/or updated set of system operating parameters.

In a further related embodiment of the present disclosure, the electronic control module, the electronic communications module, the power coupling module and any other electronically-based control or monitoring module present, operates in a timely manner to enable sufficient monitoring and control of the floating solar pod array, each module's circuits operating in a repeating cycle selected from clocked, intermittent, continuous, or when triggered by an input event or system status parameter value being achieved.

In another embodiment of the present disclosure, the electrical energy generating pod features a power coupling module, optionally programmable, having a circuit that operates to monitor the operational parameters of electronic control module, (optionally) completes an analysis by means of a software program that analyzes selected operational parameters to determine desired optimal operational parameters that maximize energy collection and transmission efficiency of the assembled solar pod array, then updates the electronic control module with the new and/or updated set of system operating parameters.

In yet another embodiment of the present disclosure, the electrical energy generating pod features a power transmitting module that comprises an electrical connection means attaching to one or more solar pods electrical coupling module to tether by means of at least one set of electrically connected positive and negative contact elements, a tether connecting a floating electrical connection means to a power storage module, a floating electrical connection means and wire leads (positive and negative) that connect to and operate to receive and transmit electrical current between connected the power coupling module and the power storage module.

In a further embodiment of the present disclosure, the electrical energy generating pod array features a power storage module having power storage means, including for example, but not limited to an air, land, barge, buoy-based or submerged electrical energy storage means including a battery, capacitor, power distribution grid, energy conversion device and the like.

In one of the embodiments of this disclosure, the floating solar collector pods (power sources) include additional accessory units (power consumers) that may be used in conjunction with, and which provide the benefit of enabling additional functional and practical capabilities to a plurality of solar collector pods that are assembled into an array while floating on a selected body of water. In related embodiments, accessory units feature similar outer dimensions, shapes and configurations, with respect to their outer perimeter and 'footprint', as those of the disclosed floating solar collector pods, and further include one or more of the automatically engaging magnetic and electrical coupling units that enable reversible attachment and electrical communication between adjacent floating solar collector pods, and some floatation means enabling the accessory unit to float on or near the surface of the water in a manner similar to that of the disclosed solar collector pods.

In one embodiment, an accessory unit is in the form of a square or hexagonal structure of the same size, shape and foot print of one or more floating solar collector pods, but features only an outer rigid wall structure and a floatation means so that the accessory unit may freely self-assemble with other similar accessory units and other floating solar collector pods, the outer rigid wall structure housing one or more of a magnetic and electrical coupling unit so that when the accessory unit is attached to the array of floating solar collector pods, all the pods attached to the accessory unit directly remain in electrical contact with the remainder of accessory units and floating solar collector pods that are also attached to the accessory unit directly, or indirectly by means of being electrically coupled into the electronic circuit of the floating solar collector pod array formed by their reversible assembly.

In other related embodiments, the accessory unit may have an outer perimeter shape in the form of any symmetrical shape capable of forming a close fitting tiled array when self-assembling edge to edge without gaps, including, but not limited to an outer perimeter shape selected from a triangle, square, pentagon, hexagon, and combinations thereof. In other embodiments, the accessory unit's outer perimeter may be in the form of a "universal" coupling ring, taking the outer perimeter and symmetrical shape of an n-sided polygon wherein n is selected from an integer from 3 to 6, wherein the universal coupling ring features at least one or a plurality (n) of electrical/magnetic coupling components located at the center point of at least one or a plurality of the flat faces of the universal coupling ring. In related embodiments, the accessory unit comprises the universal coupling ring described herein, in combination with a floatation means capable of either floating the universal coupling ring above the surface of the water, or floating a combination of the universal coupling ring and a functional accessory module that is associated with the universal coupling ring, for example, but not limited to being mounted on top of the universal coupling ring, within the universal coupling ring, below the universal coupling ring, and combinations thereof, depending on the desired functionality that the accessory unit is to deliver to the assembled floating solar collector pod array when coupled into that array physically and simultaneously coupled by means of the universal coupling ring into the electrical circuit of the pod array.

In one embodiment, the accessory unit features a transparent or empty central region so that the accessory unit effectively passes most or a substantial amount of the sunlight falling onto it into the water below the floating solar collector pod array to which the accessory unit is attached. Thus, this enables one or more accessory units to be positioned within the array so that sunlight is not completely blocked by the array when it is floating on the surface of a body of water, preventing the unwanted growth of algae and preventing other environmental issues that might result if sunlight were to be completely blocked or substantially reduced in the body of water on which the floating solar collector pod array is located.

In another embodiment, the accessory unit features a solar or electrically powered water distillation or desalination unit that is capable of treating a selected aliquot of water from the body of water upon which the floating solar collector pod array is located, and rendering that aliquot of water into potable, drinkable or at least partially or substantially desalinized water suitable for collection and use in agriculture, farming, retail and commercial uses, including drinking water. In related embodiments, a solar powered water distillation unit may be employed that either passively, by diffusion, wicking or capillary action, moves water from the body of water to the distillation unit where it is subjected to heat, either directly via sunlight or by contact with a heating element heated by the sun and/or electrical means sufficient to at least partially vaporize some of the water incident to the heating element to produce water vapor or steam, which is condensed from a vapor or gaseous state back into liquid water in a separate portion of said water distillation unit, where it may be stored or retrieved for use.

In a related embodiment, the heating element is heated in part by the sun by converting radiant energy when the sun present or when the sun is absent or present at too low of an intensity to effect heating, augmented by means of electrical energy generated and/or stored by the floating solar collector pod array such that a floating solar array sources power to the heating element which consumes power. One advantage of including a distillation unit and the like as an accessory to the floating solar collector pod array as disclosed herein, is that the underlying body of water may be used as a cooling source of water or for heat dissipation to aid the recondensing of water vapor to liquid water. In one embodiment, the distillation accessory unit includes a water pump that may operate to collect ambient temperature water from the body of water below the floating solar pod array and to direct that water into a condenser unit or condensation trap located within the distillation accessory unit in order to help cool down the water vapor and hot condensed water produced by the distillation process, greatly increasing the efficiency of the distillation process. In a related embodiment, other cooling means, including but not limited to heat sinks, heat wicks, fans, convention coolers, evaporative cooling devices, passive evaporation units and the like may also be employed on the distillation accessory unit in order to help cool down the water vapor and hot condensed water produced by the distillation process.

In a related embodiment, the distillation accessory unit includes a storage means for collecting the processed water and maintaining it separate from unprocessed water and the body of water itself. In yet a further embodiment, the distillation accessory unit includes a pump and liquid transmission means, such as but not limited to, tubing, hose, or secondary container, into which the treated water may be transferred when needed for collection or when the distillation accessory unit has filled the primary storage means with treated water or a sufficient minimum quantity warranting an extraction step to collect the treated water. In a related embodiment, an electrically powered pump is located on the distillation accessory unit connecting the primary storage means to a secondary water collection means or that is able to pump the collected treated water from the distillation accessory unit to a secondary water collection means by means of tubing or a hose or the like. In a related embodiment, the primary and/or secondary storage means may be located on the surface of the body of water or partially submerged in order that heat from the condensed treated water may be dissipated into the body of water, using the latter as a heat sink to increase the efficiency of the distillation process performed by the distillation accessory unit.

In a further related embodiment, the accessory unit features a solar or electrically desalination unit that operates when the floating solar collector pod array is located on a brackish body of water, such as an inland sea, lake or bay, ocean, delta or tidal basin where water present has at least some degree of salinity or dissolved salts rendering the water non-potable. In a series of embodiments, the desalination unit may be solar powered and/or electrically powered by electricity produced and stored by the floating solar collector pod array, producing potable water by means of a desalination process powered by means of a water pump or pressure pump sufficient to apply an adequate pressure differential for membrane-based desalination processes including, but not limited to reverse osmosis (RO), multi-stage flash (MSF), multi-effect distillation (MED), mechanical vapor compression (MVC), and combinations thereof.

Table 1 below shows the energy consumption of some selected exemplary sea water desalination methods.

TABLE 1

| Desalination Method Energy Requirements: (kWh/m$^3$)(1) | Multi-stage Flash | Multi-Effect Distillation | Mechanical Vapor Compression | Reverse Osmosis |
|---|---|---|---|---|
| Electrical energy | 4-6 | 1.5-2.5 | 7-12 | 3-5.5 |
| Thermal energy | 50-110 | 60-110 | None | None |
| Electrical equivalent of thermal energy | 9.5-19.5 | 5-8.5 | None | None |
| Total equivalent electrical energy | 13.5-25.5 | 6.5-11 | 7-12 | 3-5.5 |

1. *Encyclopedia of Desalination and Water Resources (DESWARE)*. Retrieved Jun. 24, 2013

In yet further related embodiments of the disclosure, an accessory unit may house one or more devices that can purify water by means selected from, but not limited to (1) vacuum distillation, being a process that reduces the boiling point of water by application of a partial vacuum during heating of the liquid to promote vaporization; (2) pervaporation, being a method for the separation of mixtures of liquids by partial vaporization through a non-porous membrane; (3) flash evaporation (or partial evaporation), being the partial vaporization that occurs when a saturated liquid stream undergoes a reduction in pressure by passing through a throttling valve or other throttling device, this process being one of the simplest unit operations, being equivalent to a distillation with only one equilibrium stage; (4) simple distillation and combinations thereof.

In another embodiment of the present disclosure, the accessory unit houses one or more instruments capable of measuring one or more characteristics of the water upon which the accessory unit is floating with at least one attached floating solar collection pod capable of supplying electricity to the accessory unit to power its instrumentation. Suitable instruments include, but are not limited to, devices that can measure water pH, water salinity, water temperature, conductance, water turbidity or percent transmission, total dissolved solids, ionic concentration including, but not limited to, the concentration or relative amount of sodium, magnesium, potassium and other similar alkaline and alkaline earth metal cations, and combinations thereof, and including, but not limited to, the concentration or relative amount of chloride, bromide, carbonate, phosphate, nitrate and other anions and anionic molecular species, and combinations thereof. In a further related embodiment, the accessory unit also houses a data transmission and/or data receiver device that is able to transmit and to receive information, respectively, and which operates to transmit data or information collected by the accessory unit instrumentation to a remote receiver module capable of receiving and storing the transmitted information; or conversely which operates to receive data or information sent by a remote transmission station to a receiver module associated with the accessory unit in order to illicit a response, change a program variable, turn the unit on or off, or any other desirable action or information that may be transmitted to and received by the accessory unit.

In yet another embodiment of the present disclosure, the accessory unit instrumentation includes, but is not limited to an analytical device capable of measuring and optionally storing and/or transmitting in data form, the absorption and/or fluorescence emission characteristics of a sampled aliquot of water, either before or after a processing step, in order to qualitatively or quantitatively identify the presence or relative concentration, respectively, of any detectable species of material present in the water, including atomic, molecular, biological, algae, prionic, viral and biochemical materials.

In a further embodiment of the present disclosure, the accessory unit further features a sterilizing gas generating module that operates to generate chlorine, hypochlorous acid and/or ozone gas using available oxygen and chloride ions from the atmosphere and floating body of water upon which the floating solar pod array is situated, the sterilizing gas generating module functioning to treat one or more aliquots, or a continuous stream of water taken from the water body and wherein the accessory unit is coupled to at least one or more of the solar pod units which operate to supply the accessory unit with electricity. In a related embodiment, the accessory unit further features a pump that is able to move one or more aliquots, or a continuous stream of sterilizing gas-treated water from the accessory unit to a storage unit either on board the accessory unit pod, or a secondary storage unit located in another accessory unit pod, or to a storage unit located on shore, and combinations thereof.

In another embodiment of the present disclosure, the accessory unit includes a tethering system that attaches to one point on the accessory unit and operates to hold the accessory unit within a certain proscribed distance from a fixed location to which the other end of the tether is attached, including for example, but not limited to an anchor, buoy, boat, dock, floatation device, ship, vessel, or other land-based anchoring system. In a related embodiment the tethering system further includes a means to shorten and/or lengthen the tether automatically based on prevailing conditions as measuring by one or more diagnostic sensors on the accessory unit or received by the accessory unit as transmitted information or instructions from a remote location. By means of adjusting the length of the tether, which may for example, be at least partially wound around a guiding capstan or pulley such that rotational motion of the guiding device results in either taking up or releasing the tether, which may be selected from, but not limited to, a string, fiber, rope, chain, or other suitable flexible attachment means capable of securing the floating accessory unit to some relative desirable position with respect to an anchoring point. In a related embodiment, two or more accessory units including a tethering system may be employed by attaching at least one first end of the tether located on a first accessory unit to one point on a second accessory unit, so that the tethering system operates to keep some desirable relative position or spacing between the first accessory unit and the second accessory unit, the latter which may be located in a second solar collecting pod array that is spatially displaced and not electronically or physically in contact with a first solar collecting pod array with which the first accessory unit with said first end of the tether is located. By this means, the separation between two or more solar collecting pod arrays may be maintained at a selected distance, possibly dependent on prevailing conditions, or alternatively may be used to pull two or more dispersed sections of solar collecting pod arrays together in order to enable them to reconnect to one another to reform into a larger or contiguous pod array.

In a further embodiment of the present disclosure, a floating solar pod unit may further include an onboard accessory module that operates to conduct heat from the back surface of the solar cells to the water upon which the floating solar pod unit is situated, the onboard accessory module including, but limited to, one or more of a heat sink, water pump, heat pump, refrigeration unit, evaporative cooling unit, heat wick, thermoelectric cooler, thermionic cooler, thermocouple, or other heat conductive or transferring device, and combinations thereof. In using the water from below the floating array, the solar cells may be cooled or maintained at an optimum operating temperature while receiving solar energy in order to keep the solar cells at or near the most efficient operating temperature or temperature range suitable for the conversion of incident solar radiation into electricity.

In another related embodiment of the present disclosure, a floating solar pod unit may further include an onboard global positioning signal (GPS) unit capable of sensing, receiving and/or transmitting location information, including but not limited to that individual solar pod's relative location, and further capable of optionally transmitting that location to a receiver station located on shore or on another floating solar pod unit or floating accessory unit. The floating solar pod unit may further include an onboard motor or device capable of adjusting the position of the floating solar pod with respect to another solar pod, or with respect to a collection of solar pods in an array, or with respect to some established GPS coordinates or desired location either programmed into or transmitted to or received by the onboard global positioning unit.

In a related embodiment, the disclosed global positioning signal (GPS) unit may be located on an accessory pod having only that main functionality. In a further related embodiment, the disclosed global positioning signal (GPS) unit may be located on an accessory pod having additional means to move or relocate that pod to any desired relative or absolute position with respect to the GPS coordinates of the pod or of a floating solar pod array having a onboard global positioning signal unit on one or more pods or having incorporated a dedicated accessory pod with that same GPS unit and capability.

In yet a further related embodiment, the accessory unit includes a motive means to relocate or reposition that accessory unit by means disclosed herein and including, but no limited to, a motor, a fan, a water pump, a water jet, a tethering system, and combinations thereof. In one manner of operation, an accessory pod that is attached to a floating solar pod array receives a GPS signal from one or more separated solar collection pods and/or accessory pods and employs one or more attached accessory units with said motive means to move the solar collection pod array in a desired direction with respect to said one or more separated solar collection pods and/or accessory pods.

In another related embodiment of the present disclosure, an accessory unit having motive means to relocate or reposition that accessory unit further includes one or a plurality of directional means capable of steering or orienting that accessory unit. The directional means may include, but is not limited to valves, ridges, baffles, fins, and combinations thereof, of which one or more may be optionally moveable with respect to the relative orientation of the accessory unit, and that may be used in conjunction with the motive means to move or propel the accessory unit in a desired direction. Suitable motive means include those examples disclosed herein and also include a motor, propeller, pump, valve, water jet, tether and combinations thereof. In related embodiments with fixed directional means, the motive means acts in concert with said fixed directional means to steer the accessory unit in a desired direction by means of using the motive means to impel motion when the accessory unit is positioned relatively about its axis in a configuration such that application of force by means of the motive means operates to move the accessory unit in the desired direction. Here then, the motive means would likely pulse on and off as the accessory unit rotates upon its axis and moves, the pulsing being controlled so as to impel motion to the accessory unit only when it is pointed in a position such that the motion impelled by the motive means would move it in the desired direction. In another embodiment of the disclosure relating to that immediately above, the one or plurality of directional means may be moveable with respect to their orientation with respect to the accessory pod, so that by moving their relative position with respect to the accessory pod and a fixed or moveable motive means, thus operates to move the accessory pod in the desired direction. In a further related embodiment, the motive means may be fixed in position relative to the accessory pod, and the one or plurality of directional means may be moveable instead, either acting together or acting independently under control to reposition their orientation so that they operate to move the accessory pod in a desired direction.

In one embodiment of the present disclosure, a floating solar collection pod features one or a plurality of solar panel positioning means that operate on moveable solar panels that may be moved, tilted or repositioned with respect to their orientation to the planar surface of the body of water upon which that solar pod is located, so as to enable moving the solar panel position with respect to the direction of the incident solar radiation, either to increase the electrical yield or to decrease the electrical yield of that solar panel or plurality of solar panels on that floating solar collection pod depending on conditions. In one example embodiment, a motor or motorized lever operates to adjust the tilt angle of a solar panel located on a floating solar collection pod so as to position the panel to achieve the maximum efficiency with respect to the direction of the incident solar radiation. In another example embodiment, the motorized lever operates to adjust the tilt angle of that solar panel to reduce the efficiency or to reduce the voltage and/or current output from the solar panel.

Accordingly, in these and other related embodiments of the disclosure, the one or plurality of solar panel positioning means may be selected from a motor, motorized lever, rack-and-pinion drive, screw drive, piezoelectric membrane, rod or lever, water, hydraulic oil and/or air inflatable balloon, sachet, sack, piston or membrane and combinations thereof, which may be reversibly moved or repositioned from a first position to a second position, or alternatively may be reversibly adjusted from a first size to a second size, wherein said reversible movement or adjustment operates to move or tilt the solar panel position with respect to either the orientation of the solar collection pod or the direction of the incident solar radiation falling on the solar panel fitted with the solar panel positioning means.

In an embodiment of the present disclosure, an accessory unit hosts an electrical storage system for the collection of electricity generated by one or more floating solar collection pods or an array of said pods associated with said accessory unit. In this manner, the electrical storage system may collect electric charge from one or more attached solar collection pods or an array of said pods, and may further transfer that electric charge to a secondary power storage or redistribution center located near the solar collection pod array or on the shoreline. One advantage of having one or a plurality of accessory units featuring an electrical storage system is for the collection of surplus electricity when the output of the collective solar collection pod array exceeds the instantaneous usage or onshore storage capacity, enabling the one or plurality of accessory units so configured to retain electric charge until needed. A further advantage is that having a least one accessory unit with an electrical storage system enables the attached solar collection pod array to be powered, even at night when there is no incident solar energy and thus no production of electricity at the time, in order for diagnostics, GPS, solar panel positioning means, motive means, and other electrical monitoring circuits, devices, warning lights, navigation lights, beacons, radio transmitters and the like, and combinations thereof, to have available electrical power to operate even when the solar collection pod array is not itself producing electricity from incident solar radiation, such as for example, but not limited to, when at night or when the sky is cloudy.

In a related embodiment of the disclosure, an accessory unit hosts a current and/or voltage control module that operates to control the minimum, maximum and operating current or voltage output of one or more associated solar collection pods or an array thereof. In one example embodiment, a current control module is an electronic circuit that detects either an individual solar collection pod current output or that of an array of connected solar pods, and then acts on the detected current level to adjust the relative wiring configuration of one or more of the associated solar collection pods within the array so as to control the total amount of current being produced by the array. In one example embodiment, the current control module detects an increasing current that exceeds a maximum preset safety level, and then operates to change the relative wiring configuration of two or more solar collection pods to be either in electrical series, electrical parallel, or a combination of both, so that the output voltage of the collective solar collection pod array may be adjusted to control the actual current output to within a desired range or target value.

Conversely, in another related embodiment, a voltage control module is an electronic circuit that detects either an individual solar collection pod voltage output or that of an array of connected solar pods, and then acts on the detected voltage level to adjust the relative wiring configuration of one or more of the associated solar collection pods within the array so as to control the total level of voltage being produced by the array. In one example embodiment, the voltage control module detects an increasing voltage that exceeds a maximum preset safety level, and then operates to change the relative wiring configuration of two or more solar collection pods to be either in electrical series, electrical parallel, or a combination of both, so that the output current of the collective solar collection pod array may be adjusted to control the actual voltage output to within a desired range or target value.

In a further related embodiment of the present disclosure, a combined voltage and current control module may be used that operates as described herein to effectively control both the current and the voltage output of one or a plurality of floating solar collector pods or an array thereof, to generate current and voltage levels that are both within prescribed lower and upper maximums or at or within some preselected safe or efficient operating value.

In another related embodiment, the solar collection pod or an associated accessory unit features a power conditioning module, selected from, but not limited to a current regulator, voltage regulator, combined current/voltage regulator, phase inverter, voltage inverter, and combinations thereof, which operates to condition the output of one or more floating solar collection pods or an array thereof so as to be within a desired voltage and/or desired current range, wherein said voltage or current may be inverted from a direct current to an alternating current and vice versa, as desired, in order to condition the power output to a desired configuration of voltage, current and power type (i.e. direct "DC" or alternating current "AC").

In a further related embodiment, each solar collection pod features an onboard mini or micro-inverter module that has sufficient capacity to operate within the voltage and current limits of that particular solar collection pod. In yet a further embodiment, one or more accessory units associated with a floating solar collection pod or an array of such pods features a macro-inverter that has greater voltage and current capacity and may be used alone, or in combination with floating solar collection pods having the smaller mini or micro-inverter modules. In another related embodiment, one or more of the micro, mini and macro-inverters may be independently controlled to adjust the level of current and/or voltage produced by one or more of the solar collection pods, as well as independently controlled to condition the power output of the collective pod array to a desired power type.

DETAILED DISCLOSURE

FIG. 1 shows a side view of one embodiment of a solar collector pod that floats upright in the water and has means to physically and electronically connect to adjacent pods and transmit electrical energy. Here the solar collector pod 100 features a solar concentration module 102 that is positioned above a radiant energy conversion element 104 and which serves to collect and focus incident solar radiation from the sky onto an operative surface of the radiant energy conversion element 104, which operates to convert the incident radiation into some form of electrical or thermal energy capable of being stored or transmitted to a power storage facility. The solar concentration module 102 and the radiant energy conversion element 104 are located on the upward facing side of a buoyant floatation module 112 that operates to maintain the solar pod in an approximately upright position in the water, indicated by the wavy line 116 being a representative water line level or plumb level of the solar pod as it floats on or near the surface of a body of water. In one embodiment of the present disclosure, the solar collector pod 100 may store the electrical energy output from the radiant energy conversion element 104 in a battery or similar electronic storage device located onboard the solar pod. FIG. 1 also shows one embodiment of an inter-pod electrical coupling module and a physical coupling module, both of which act to establish one of a physical and an electrical connection, respectively, to adjoining solar collector pods which are attached together.

In FIG. 1, one embodiment of a combined electrical and physical coupling module 105 is shown featuring a positive electrode 106 and a negative electrode 110 that are electrically isolated from one another and from any metal components present that are not part of the electrical charge collection or control circuitry. The electrode 106 and 110 may be formed from any electrically conducting material including but not limited to gold, copper, conducting polymers and the like. Here, the magnetic coupling element 108 is located proximate to the electrodes 106 and 110, and operates to attract an identical magnetic coupling element located on an adjacent pod, the magnetic attraction serving to first align the adjacent pods into an attachable configuration by means of magnetic field polarity and attraction, and then serving to strongly attract and then reversibly bind two adjacent pods into close physical proximity by means of two interacting strong magnetic fields of attraction, the two adjacent pods each having electrical and physical coupling modules 105 present on an accessible side or edge of their respective pods. In one embodiment of the present disclosure, the magnetic coupling element is slightly recessed with respect to one or more of the positive or negative electrodes so that the magnets do not physically contact one another, preventing damage to the magnets, but serving to maximize and maintain a strong magnetically attractive force between the adjacent electrical and physical coupling modules 105 so as to maintain a strong and effective electrical contact between the respective electrodes of the adjacent solar collector pods. FIG. 1 also shows an optional pod counterweight 114 that can be attached to or placed within or integrated into the buoyant floatation module 112 of the solar pod in order to help maintain the solar collector pod's orientation in the water and minimize motion owing to incident waves, wind and currents at or near the surface of the water. In another embodiment of the present disclosure, the solar collector pod 100 is an electrical energy generating pod that operates to generate electrical energy from other energetic sources including solar radiation, wind, wave action, water currents, and combinations thereof.

Figure 2:
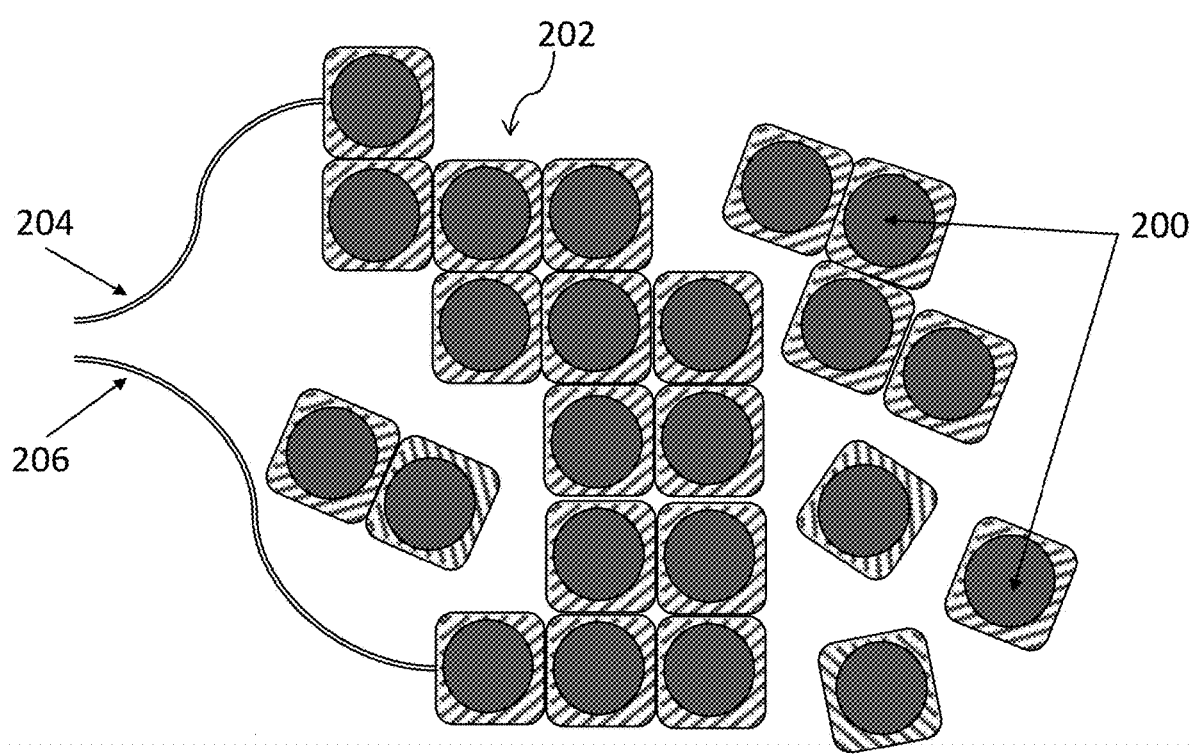
FIG. 2 shows a collection of square-shaped solar collector pods, some attached forming a connected array and others yet to attach in time, with an attached power tether acting as an electrical collection conduit.

FIG. 2 shows one embodiment of the present disclosure featuring a collection of square-shaped solar collector pods 200, some attached forming a connected solar collector pod array 202 and others solar collector pods 200 yet to attach (in this frame of time), with an attached power tether acting as an electrical collection conduit featuring a negative collection conduit 204 and a positive collection conduit 206. Over time, wave action and currents in the water tend to move the free solar collector pods 200 around in a manner which brings them into close proximity. When adjacent solar collector pods 200 come close enough for the magnetic fields of their respective physical coupling modules to interact, the pods will become aligned and attract one another and attach or couple owing to the strong magnetic field shared between the respective physical coupling modules 105 which then operate to bring the adjacent electrical electrodes into contact with one another, enabling electrical contact between the adjacent solar collector pods and as additional solar collector pods 200 join the growing solar collector pod array 202 to establish additional inter-pod physical and electrical coupling configurations that operate to establish a coupled, connected electrical contact and electrical communication between all the connected solar collector pods 200 within the pod array.

Figure 3:
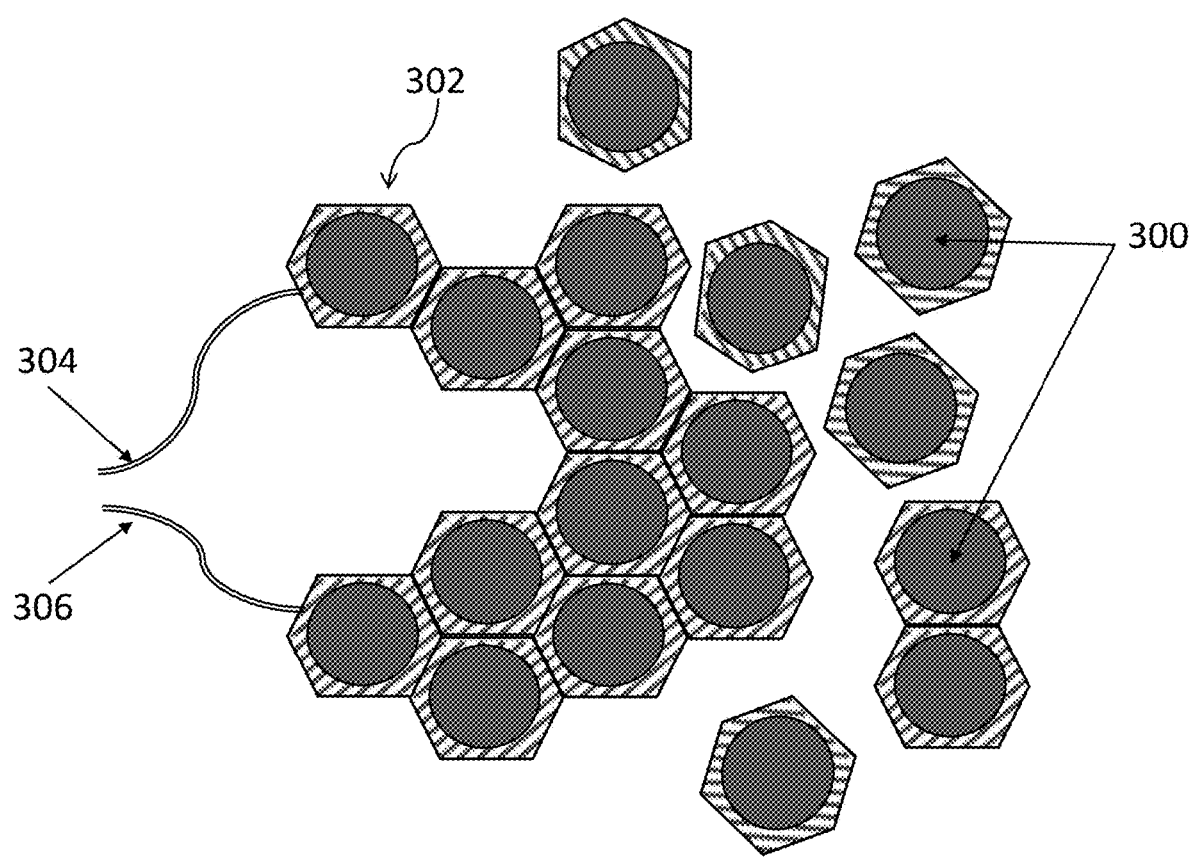
FIG. 3 shows a collection of polygon-shaped solar collector pods, some attached forming a connected array and others yet to attach in time, with an attached power tether acting as an electrical collection conduit.

FIG. 3 shows one embodiment of the present disclosure featuring a collection of polygon-shaped solar collector pods 300, some attached forming a connected solar collector pod array 302 and others yet to attach in time such as pods 300. An attached power tether acts as an electrical collection conduit and featuring a negative collection conduit 304 and a positive collection conduit 306 in electrical contact and communication with the solar collector pod array 302 by means of connecting to one or more of the solar pods that themselves are attached to or comprise a member of the pod array 302.

Figure 4:
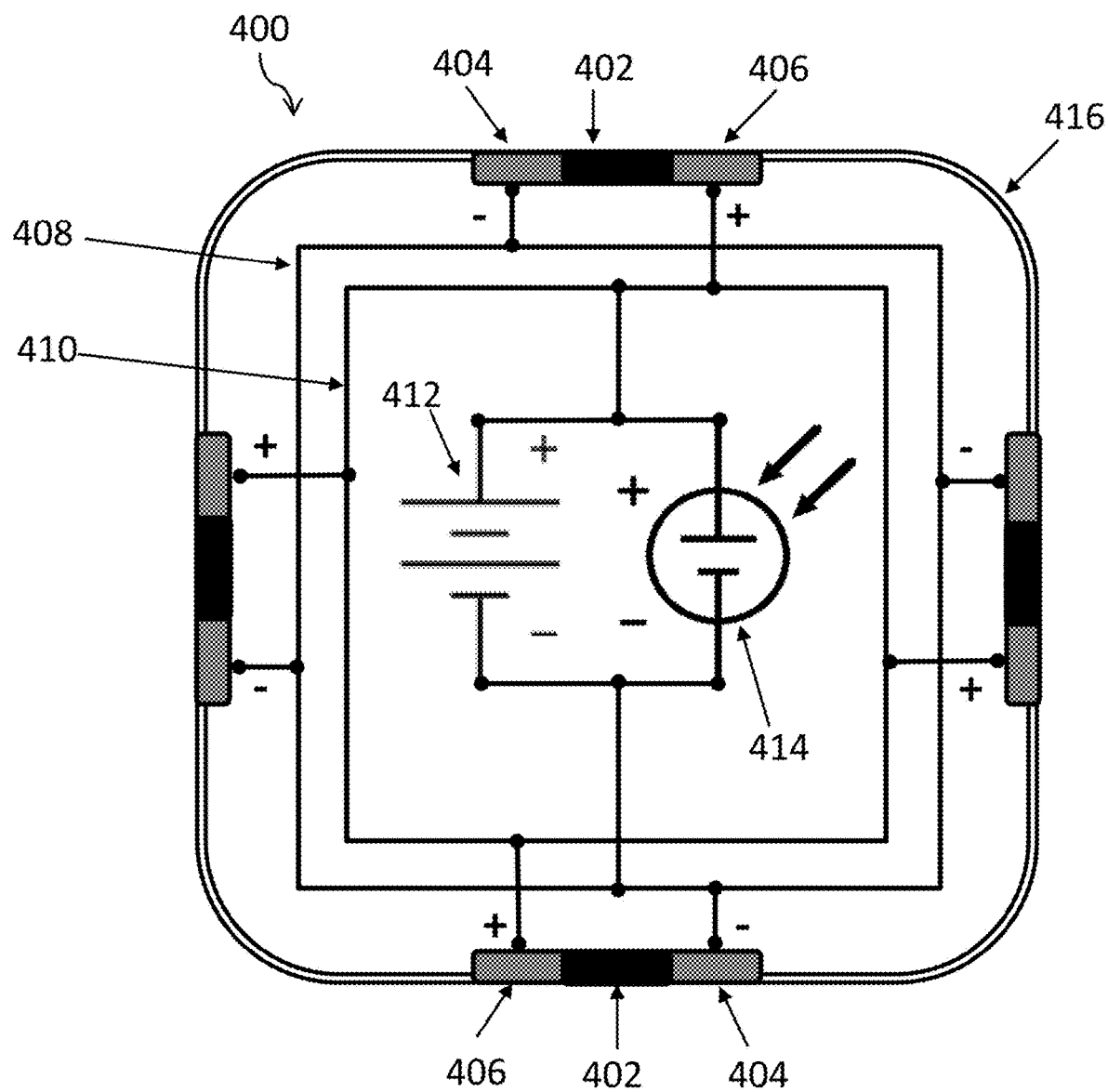
FIG. 4 shows a top view and schematic diagram of the internal circuit connections of one embodiment of a solar collector pod with four connection modules located on the outer periphery of the pod, with a solar cell and battery storage device.

FIG. 4 shows a top view and schematic diagram of the internal circuit connections of one embodiment of the present disclosure in which a solar collector pod 400 has four combined physical and electrical connection modules 403 (not labeled in figure) located on the outer periphery of the pod, the combined physical and electrical connection modules 403 each having a negative connector element 404, a positive collection element 406 and a magnetic connector element 402, the latter operating to attract, align and magnetic connect or couple adjacent magnetic connector elements located on adjacent solar collector pods to bring two or more of the solar collector pods 400 into contact and further operating to establish and maintain a close electrical connection between adjacent pairs of the negative connector element 404 and positive connector element 406 located on adjacent but coupled solar collector pods. In one embodiment of the present disclosure, all negative connector elements 404 are electrically connected together in a negative current loop 408 as represented in FIG. 4 in a parallel configuration with respect to one another and simultaneously electrically connected and in communication with the negative output terminal of the solar cell element 414. In this embodiment, all positive connector elements 406 are electrically connected together in a positive current loop 410 as represented in FIG. 4 in a parallel configuration with respect to one another and simultaneously electrically connected and in communication with the positive output terminal of the solar cell element 414. Thus, in this present embodiment, the electrical potential or charge generated by incident radiation interacting with the solar cell element 414 is communicated electrically to the positive current loop 410 and simultaneously to the negative current loop 408, which operates to establish a voltage potential between the respective positive and negative current loops, and through which electrical energy can flow. Certain embodiments may include conventional short circuit protection and polarity protection (such as a diode), to allow for misalignment conditions.

Returning to FIG. 4, a rechargeable battery 412 is present in the solar collector pod 400 and electrically connected to the positive current loop 410 by means of the battery's positive terminal and simultaneously electrically connected to the negative current loop 408 by means of the battery's negative terminal, so that the battery is in a parallel electronic configuration with respect to the solar cell element 414, enabling the rechargeable battery 412 to be charged by the solar cell element 414 when the solar cell is producing electricity. Typically, diodes or other conventional control equipment may operate to prevent the battery from discharging its electrical energy when the solar cell is quiescent and not producing a net electrical output, say during the night or when the solar cell is disengaged from the circuit by damage or deliberate exclusion, say manually or automatically when temperature or current levels exceed some predetermined maximum threshold value triggering a cutoff switch or protective circuit associated with the solar cell element 414. In one embodiment of the present disclosure, the solar cell element 414 is electrically detached from either the positive or negative current loop when the solar collector pod 400 is isolated, that is not connected to a power collection tether or to an adjacent solar collector pod, so as to prevent the build-up of an electric charge and subsequent production of a spark or electrical discharge when adjacent solar collector pods 400 first come into physical and electrical contact with one another. Certain embodiments may be effectuated that include the battery 412, but operate without the solar cell element 414. This may allow for a storage pod which couples to other pods to receive and supply energy.

Figure 5:
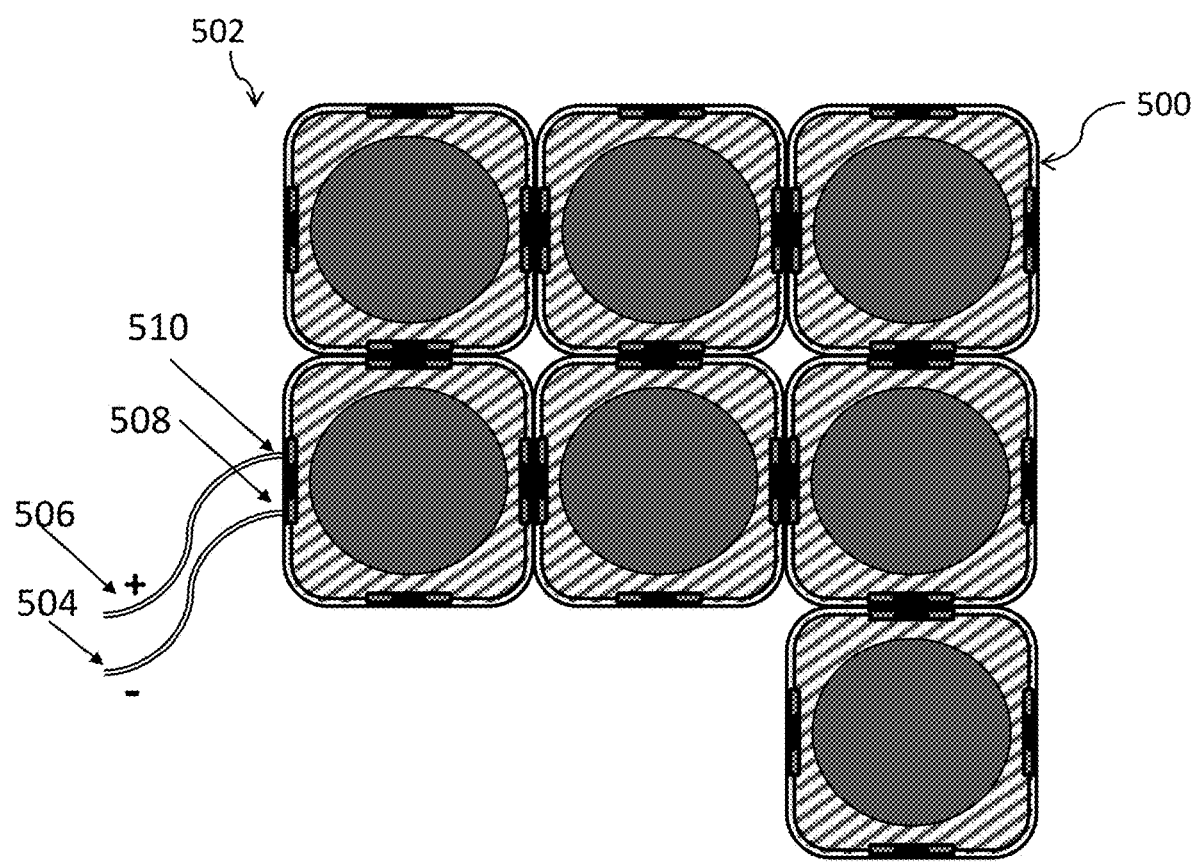
FIG. 5 shows a connected array of solar pods connected by means of a physical coupling module and an electrical coupling module that maintains the array in close physical proximity and electronically coupled to one another.

FIG. 5 shows one embodiment of the present disclosure in which solar collector pods 500 are connected in a solar collector pod array 502 by means of a combined physical coupling module and an electrical coupling module that maintains the array in close physical proximity and electronically coupled to one another, and enables a power collection conduit comprising a negative collection conduit 504 and a positive collection conduit 506 to connect to and establish an electrical connection to a single physical/electrical coupling module located on the same solar collector pod. Here, the negative and positive collection conduits 504 and 506, are attached to the operative negative connector of the pod array 508 and the operative positive connector of the pod array 510, respectively. In this present embodiment, the internal negative and positive current loops, 404 and 406 (See FIG. 4) connecting the plurality of combined physical and electrical connection elements 405 enable the solar collector pod array 502 to be in electrical contact and communication with one another and with the solar collector pod that is attached to the negative and positive collection conduits, 504 and 506.

Figure 6:
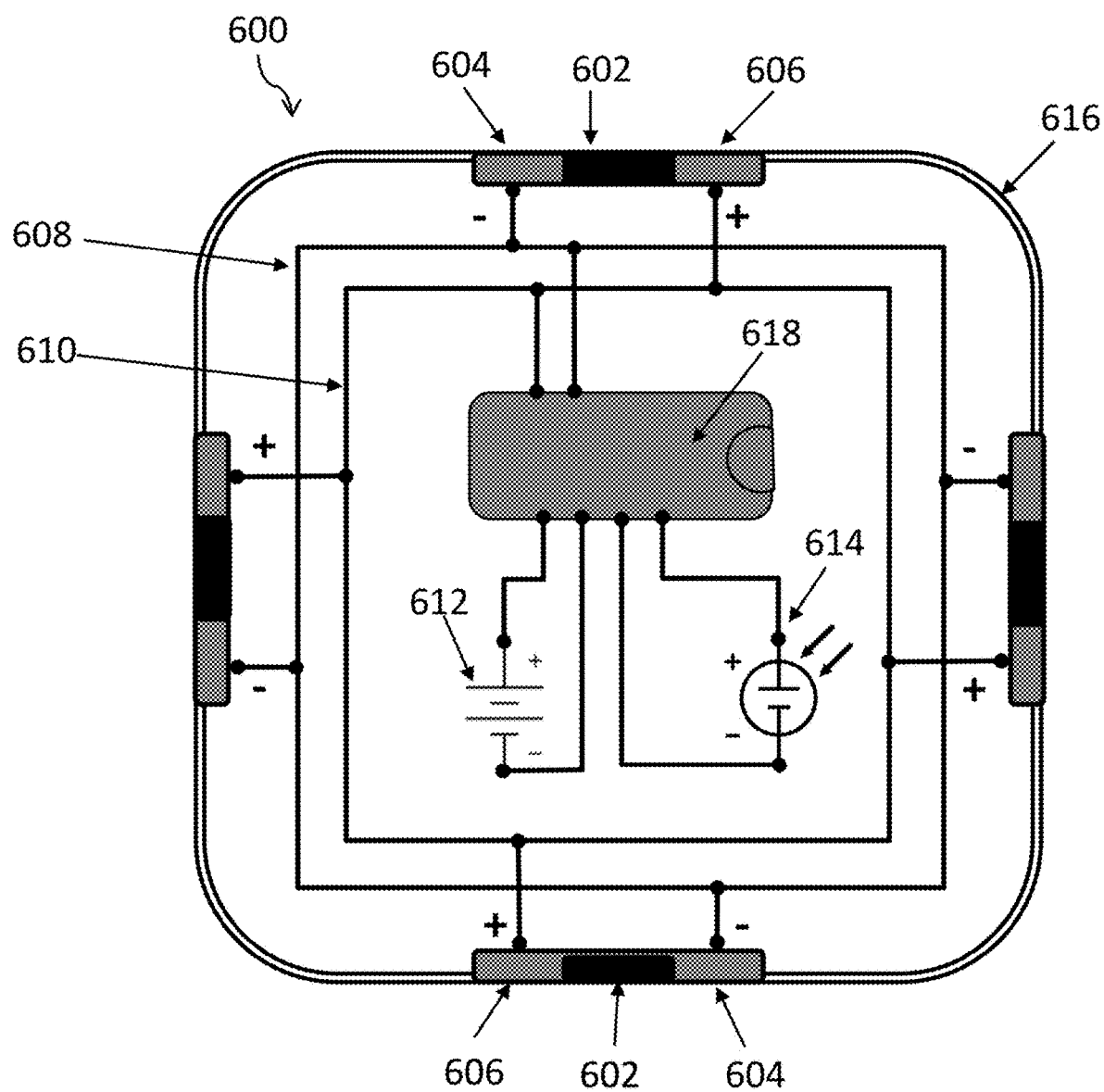
FIG. 6 shows a top view and schematic diagram of the internal circuit connections of one embodiment of a solar collector pod with four connection modules located on the outer periphery of the pod, with a solar cell and battery storage device that is regulated by means of a (optionally programmable) electronic control module.

FIG. 6 shows a top view and schematic diagram of one embodiment of the present disclosure featuring an internal circuit comprising an electronic control module 618. Here the electronic control module 618 is simultaneously in electrical contact and communication with the negative current loop 608, the positive current loop 610, the solar cell element 614 and a rechargeable battery 612. The electronic control module 618, optionally programmable, has a circuit that operates to regulate the electrical output of the solar energy conversion module or solar cell element 614, control charging of onboard energy storage device or rechargeable battery 612, which includes but is not limited to a capacitor, a rechargeable battery, or combination thereof, and the like being capable of storing electrically energy. In a related embodiment of the present disclosure, the electronic control module 618 further operates to monitor the electrical status of the radiant energy conversion element and the onboard energy storage device or rechargeable battery 612, and provides a signal to the user or to a power coupling unit wherein the signal operates to indicate the current circuit status, charging status, battery or energy storage status and related system parameters of the circuits to which the electronic control module 618 are in electrical communication.

Figure 7:
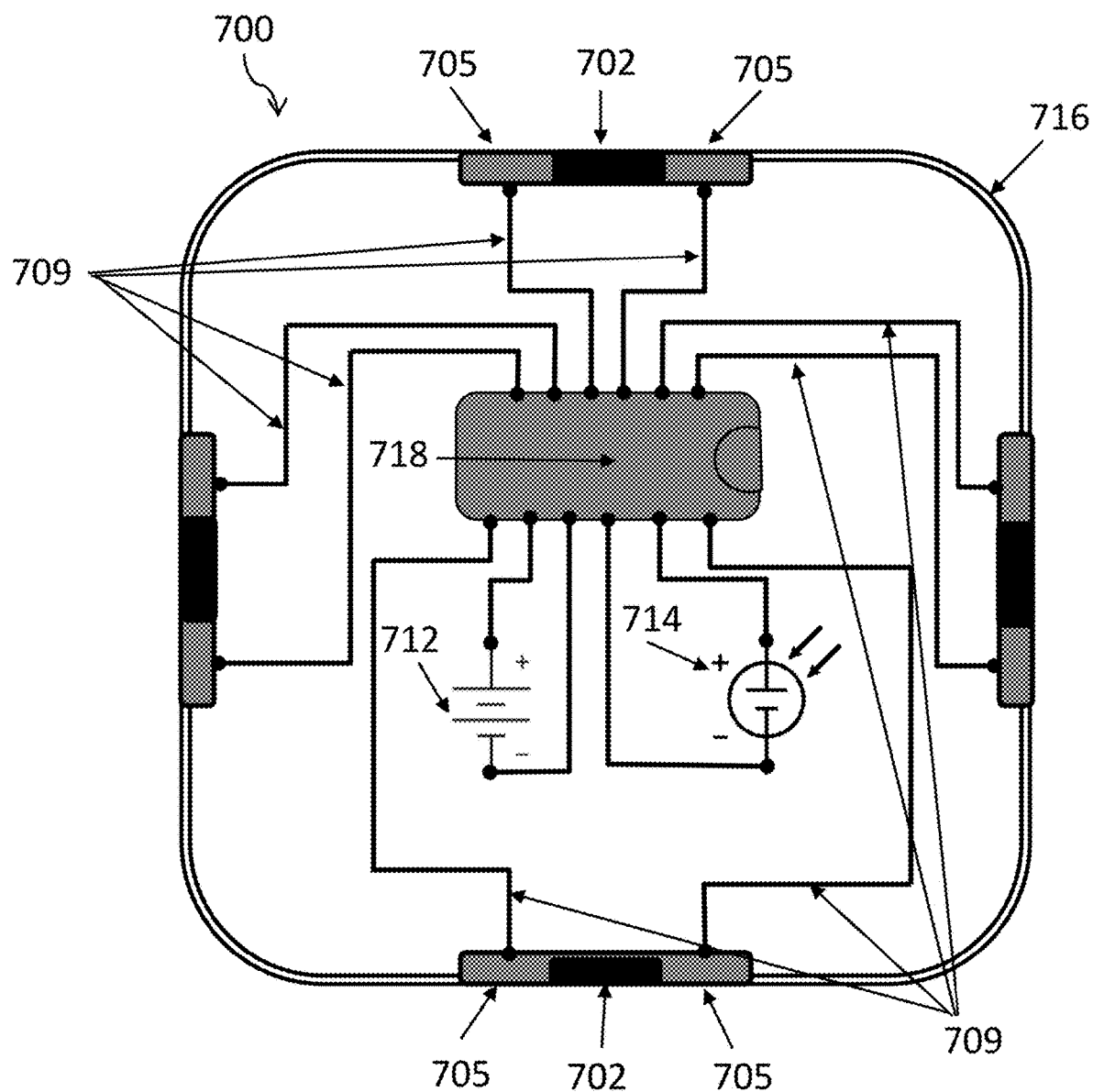
FIG. 7 shows a top view and schematic diagram of the internal circuit connections of one embodiment of a solar collector pod with four connection modules located on the outer periphery of the pod, with a solar cell and battery storage device that is regulated by means of a (optionally programmable) combined electronic control module and a power coupling module that controls the polarity and connectivity of each elect electrode so that adjacent solar pods can be connected in series and/or parallel electrical configurations as desired.

FIG. 7 shows a top view and schematic diagram of the internal circuit connections of one embodiment of the present disclosure featuring a solar collector pod with four combined physical/electrical connection modules (not labeled) located on the outer periphery of the solar collector pod 700, with a solar cell element 714 and a rechargeable battery 712 as an electronic storage device that is regulated by means of a (optionally programmable) combined electronic control module and a power coupling module 718 that controls the polarity and connectivity of each programmable connector element 705 (an electrode without a fixed polarity) so that adjacent solar pods can be connected in series and/or parallel electrical configurations as desired by means of the power coupling module 718 determining the corresponding desired configuration of positive and negative electrodes and assigning these configurations to the corresponding set of programmable connector elements 705 that are in electrical contact and communication with the adjacent, electrically coupled solar collector pods. In this embodiment of the disclosure, the plurality of individual programmable connector elements 705 are connected to the power coupling module of the combined control module 718 by means of a plurality of programmable current loops 709 which can be programmed to be either a positive, negative or neutral electrical connection by the power coupling module 718.

In operation, the electronic module portion of the combined electronic and power coupling module 718 performs the task of monitoring the electrical output of the onboard solar cell element 714 and the voltage and charging state of the onboard rechargeable battery 712. As adjacent, electrically connected and coupled solar collector pods attach to the solar collector pod 700, the power coupling component of the control module 718 senses voltage and/or current at the newly formed connection points made when two programmable connector elements 705 come into contact, and then operates to determine the best circuit configuration with respect to the newly attached adjacent solar collector pod in order to maximize either current or voltage for the most optimal electrical conversion efficiency for collecting the electrical power and/or for charging the onboard rechargeable battery 712.

Accordingly, in one embodiment of the present disclosure, the power coupling component of module 718 determines the positive and negative polarity of each separate programmable current loop 709 so that the polarity of the corresponding programmable connector element 705 to which it is in electronic contact have the desired polarity or neutrality so as to enable the establishment of a circuit between each adjacent, connected solar collector pod within the solar collector pod array, wherein the circuit is programmable by the power coupling component of the module 718 to place the solar cell element 714 and/or rechargeable battery 712 and/or the programmable current loops 709 into either a parallel, series or combination of parallel or series electrical configurations in order to control the overall voltage output and/or current output of the assembled, connected solar collector pod array. In a related embodiment of the present disclosure, the power coupling component of the control module 718 can isolate a defective solar collector pod from the array, but continue to use selected programmable current loops 709 and programmable connector elements 705 on the defective solar collector pod to maintain that pod and other adjacent pods to it in effective electrical communication without negatively impacting the energy collection and storage of the assembled solar collector pod array having one or more defective or non-responsive (say it has passed into shade) solar collector pods.

Figure 8:
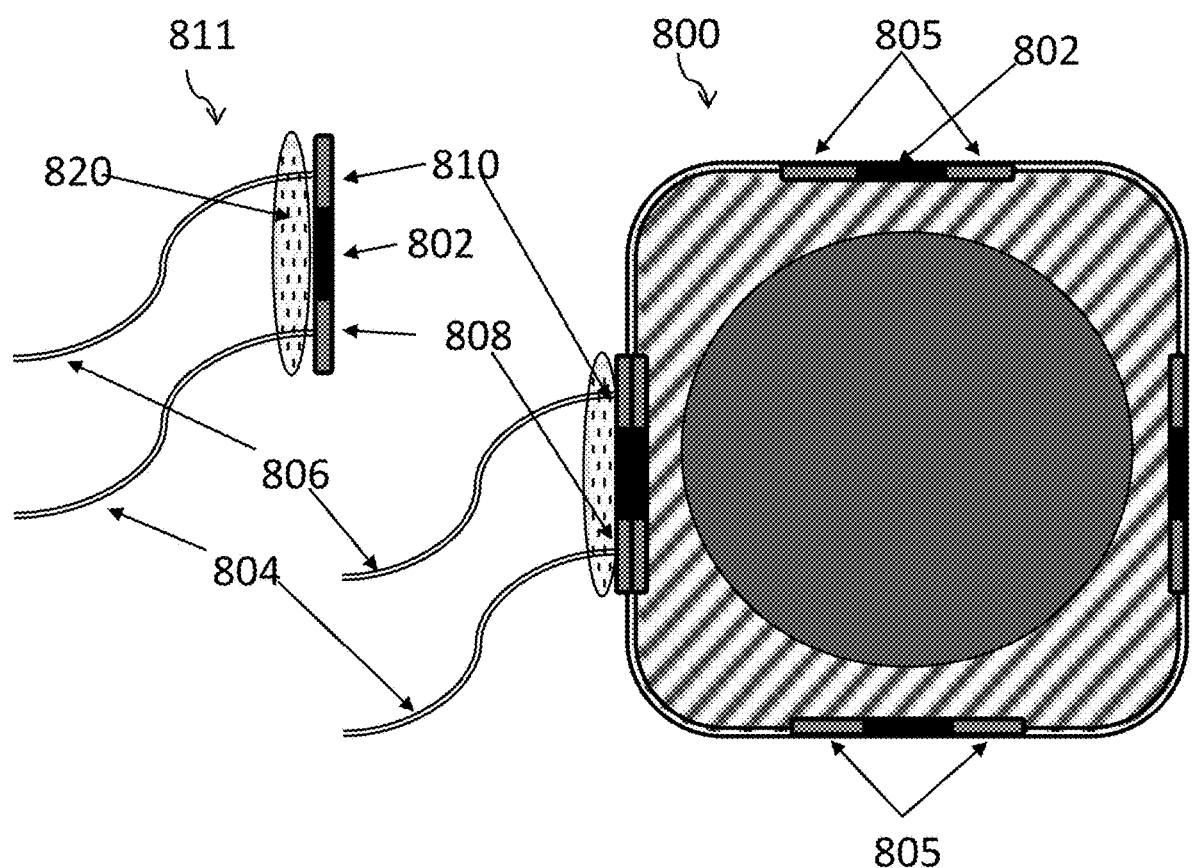
FIG. 8 shows a floating power transmitting module having a tether and a physical/electrical connection module that operates to automatically attach to an adjacent floating pod, shown connected to the power transmitting module on the right side of the frame.

FIG. 8 shows a top view and diagram of the external power connections of one embodiment of the present disclosure featuring a floating power transmitting module 820 having a tether comprising a programmable negative connector 808 and a programmable positive connector 810, and a physical/electrical power connector 811 that attaches to the floating power transmitting module 820 to the solar collector pod 800 by means of the mutual magnetic connector elements 802 which attract one another and then operate to attach module 820 to module 811 which thereby establishes at least two electrical connections to the corresponding programmable connector elements 805. In this embodiment, the positive collection conduit 806 and the negative collection conduit 804 collect and transmit power from the onboard energy storage means (battery) or solar cell, and transmit it to an external energy storage means (not shown). In other embodiments, the floating power transmitting module 820 can have two or more attached power connection units 811 in electrical communication with the negative and positive collection conduits, and such electrical communication can be electrically in series, or in parallel or in some desired combination of both series and parallel configurations with respect to the attachment of two or more floating solar collector pods. In a related embodiment, the floating power transmitting module has a branched configuration with at least one additional power connection unit 811 attached and in electrical contact and communication with each of the negative and positive collection conduits. In a further related embodiment, the floating power transmitting module has a dendritic configuration, a ladder configuration, additional branched configurations and combinations thereof which operate to place the respective individual solar collector pods of an assembled solar collector pod array into either a series electronic configuration or a parallel electronic configuration, or a combination thereof, will respect to the negative and positive collection conduits 804 and 806.

Figure 9:
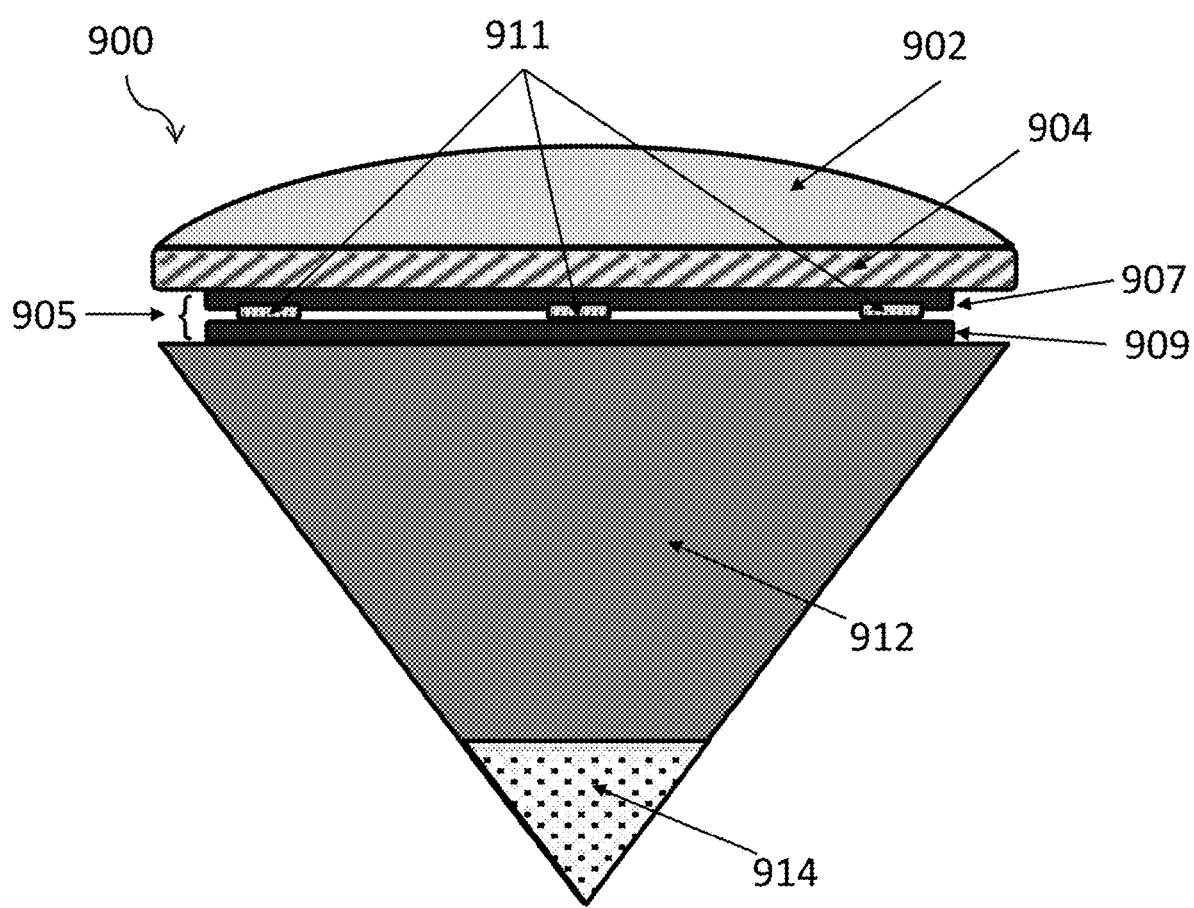
FIG. 9 shows a side view of a solar pod featuring an intra-pod connection means featuring a plurality of connection modules that reversibly attach a buoyant floatation module to the solar energy conversion module.

FIG. 9 shows a side view of one embodiment of the present disclosure featuring a solar collector pod 900 featuring an intra-pod connection means 905 that comprises a plurality of interlocking regions 911 that reversibly attach a buoyant floatation module 912 to a radiant energy conversion element 904 by means of a first interlocking element 907 that is physically attached to element 904 and a second interlocking element 909 that is physically attached to module 912. Thus, in this embodiment, the upper portion of the solar collector pod 900 consisting of the solar concentration module 902, the radiant energy conversion element 904 and the first interlocking element 907 may be reversibly attached and removed from the lower portion of the solar collector pod 900 comprising the buoyant floatation module 912 and the second interlocking element 909. This embodiment provides the means to partially disassemble each solar collector pod 900 into two smaller components, the upper portion being relatively flat and stackable during storage or transport, and the lower portion being stackable (like traffic cones) during storage or transport.

Counterweight

In one embodiment, the pod counterweight 914 is removable and can be separated from the buoyant floatation module. In related embodiments, the selection of the proper pod counterweight in terms of size and weight can be made by considering whether the body of water in which the solar collector pod is to be placed is fresh, salt or brackish water, in order to stabilize and position the solar collector pods at the desired depth when floating on the surface of the body of water. Moreover, pod counterweights may be effectuated that would cause the pod to right itself should the pod be overturned. For example and without limitation, a pod counterweight may be on an extended arm which would be unstable in the event to pod were to overturn. Certain embodiments may have a porous flotation module 912 or counterweight 914 which may partially fill with liquid from the area it is floating in, thus effectuating a counterweight. The porosity of the flotation module 914 or the counterweight 914 may be adjusted to set the height of the pod 900 in its respective fluid. Some embodiments may have shaped flotation module 912 or counterweight 914 depending on the application. For example and without limitation, an ocean-going pod 900 might have a cross shape to provide a counter force to any rotation whereas a pod 900 designed for operation in a river or aqueduct may have a fin or keel shape to help align the pod 900 with the liquid flow.

The first and second interlocking elements, 907 and 909, respectively of the intra-pod interlocking element 907 may be selected from, but not limited to one or a plurality of an interlocking set of tangs and grooves, hook and loop fasteners (Velcro or industrial grade Velcro), magnetic coupling elements, magnets, pins and pin receiving ports, screws and tapped screw receiving holes, reversible adhesive elements, physical coupling elements including hinge and pins, dowels, springs, and the like, and combinations thereof, sufficient to enable the attachment of the upper and lower portions of the solar collector pod as disclosed hereinabove in a fixed configuration during use, but also to enable the detachment of these same upper and lower portions for convenient storage and/or transportation.

The floating module 912 and the counterweight 914 may be made from bio-inert or biocompatible material to prevent any leaching or contamination of the fluid upon which it floats. For example and without limitation, the liquid contact portion of the pod 900 may be made from TEFLON, stainless steel, and the like.

Coupling

Figure 10:
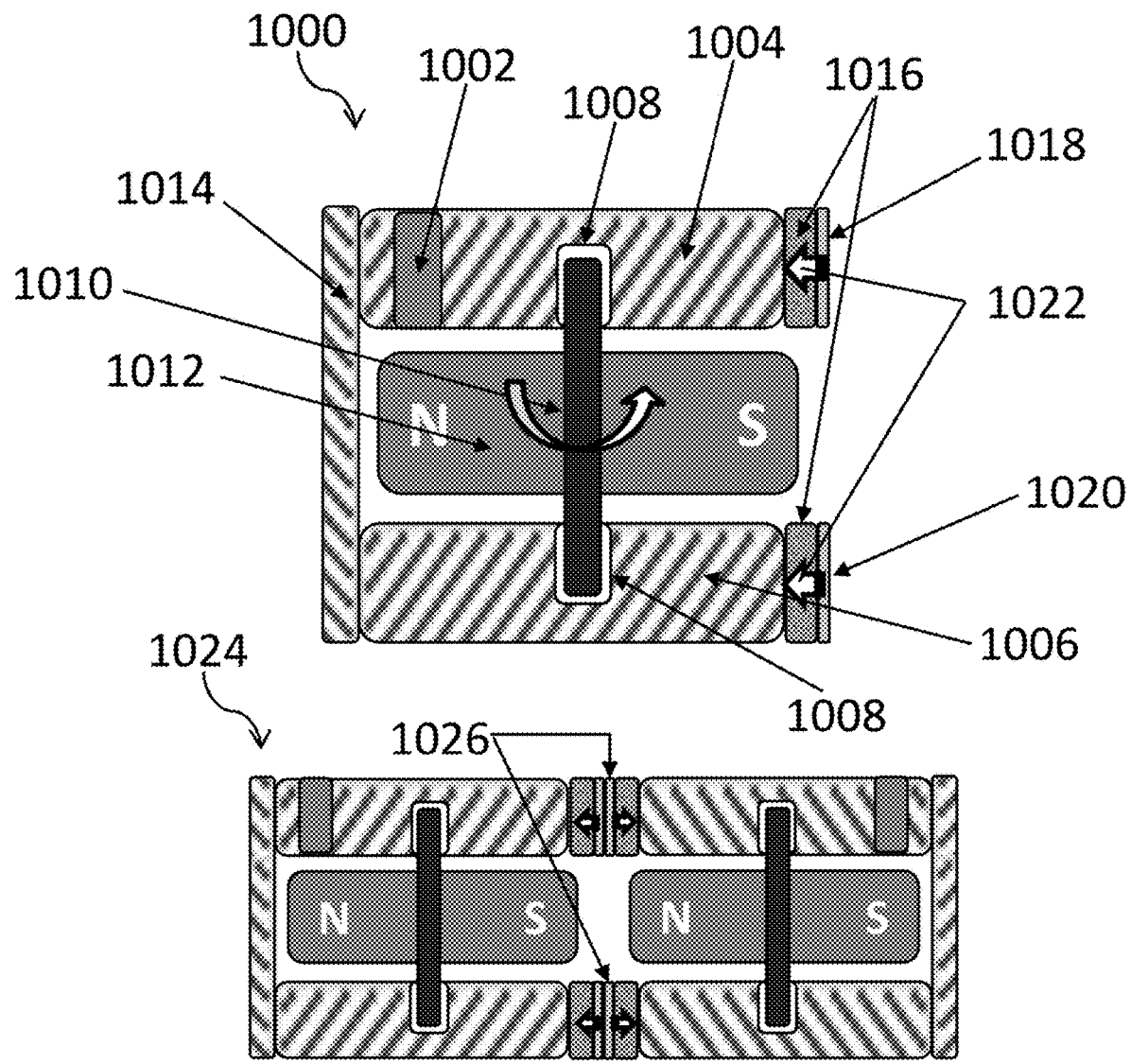
FIG. 10 shows a side and planar cross-sectional view of a combined physical and electrical coupling module that uses a rotating magnet to align and couple with an adjacent coupling module to bring the two into contact establishing electrical communications between adjacent solar pods.

FIG. 10 shows a side and planar cross-sectional view of one embodiment of a combined physical and electrical coupling module 1000 that uses a rotating magnet 1012 to align and couple with an adjacent coupling module (note 1024) to bring the two into contact establishing one or more physical and electrical contact regions 1026 in order to establish electrical contact and communication between adjacent solar pods. Here, the combined physical and electrical coupling module 1000 features an optional dampening element 1002 located within or proximal to the first support yoke 1004 which has a first pivot bearing element 1008 which holds and guides a first end of the pivot rod 1010 which passes through the approximate center of the magnet 1012. The dampening element 1002 operates to prevent the free and rapid rotation of the magnet around the pivot access and may be selected from a ferrous metal, a magnet, a paramagnetic material, a magnetic material, and the like. The first support yoke 1004 is attached to or optionally can be integrated with or be one contiguous element also featuring a second support yoke 1006 that also features a second pivot bearing element 1008 which holds and guides a second end of the pivot rod 1010, so that the pivot rod 1010 and magnet 1012 or both are freely capable of rotating around the longitudinal axis of the pivot rod, enabling the magnet to move freely and present either its "N" (north magnetic pole) or its "S" (south magnetic pole) to interact with an adjacent magnet present on an adjacent coupling module present on an adjacent solar collector pod.

In another embodiment of the present disclosure, a magnetic keeper plate 1014 is located proximate to, but not in direct contact with the magnet, and is constructed of a ferrous material that acts as a magnetic field stabilizer in order to help preserve the strength of the magnet 1012 and also to prevent its free rotation about the pivot rod 1010 when not interacting with an adjacent magnet located on an adjacent solar collector pod. In a further embodiment of the present disclosure, the first and second support yokes feature a magnetic spacer element 1016, which is sized to prevent the magnets from adjacent, coupled modules (as shown in 1024) from coming into direct physical contact. The magnetic spacer element 1016 thus acts to enable alignment and coupling of the two adjacent magnets but maintains a physical separation between the magnets so that the continued attractive force between the close but separated magnets remains positive and operates to keep the electrical contacts, positive 1018 and negative 1020, or alternatively programmable electrical contacts in a closely connected configuration held together by the resulting magnetic attraction of the magnets which continuously acts to drive the magnets, and hence the attached electrical contacts into one another, establishing a reversible but strong electrical connection between the faces of the electrical contacts that are in contact with each other. In a further embodiment, the magnetic spacer element 1016 also acts as an electrical insulator, so that the respective charges and electrical currents passing through the attached electrical contacts, 1018 and 1020 remain isolated from each other and from any metal present in the solar collection pod.

In yet a further embodiment, the magnetic spacer element 1016 further includes a spring tension element 1022 that is connected to the non-contact side of the electrical contacts 1018 and 1020, and connected to the magnetic spacer element 1016 in order to produce a small but steady outwardly directed spring decompression force that acts to move the electrical contacts outward and thus operates to keep connected electrical contacts in close contact owing to the opposing spring forces of two interconnecting electrical contacts in a coupled pair 1024 of the physical and electrical coupling modules 1000, establishing a good physical and electrical contact region 1026 between opposing outer faces of the respective electrical contacts 1018 and 1020. Accordingly, in one embodiment of the present disclosure, the combination of the offset magnetic force (from the close but separated magnets) and the spring tension force of the spring tension elements 1022, act together to push the electrical contacts into a closely coupled and stable configuration having both good physical and electrical connectivity, yet still enable the disengagement of the connected units when desired by manual or automatic separation by the application of an outward force sufficient to overcome the magnetic attraction between the magnets of the physical coupling module 1000.

In a another embodiment, the magnetic keeper plate 1014 is attached to an electromagnet module that can be activated to temporarily magnetize the magnetic keeper plate in order to align the rotating magnet into a desired position, and by means of temporarily magnetizing the two respective magnetic keeper plates of two adjacent and attached physical coupling modules with the same polarity, then operates to turn the two respective magnets so as to repel one another, which then results in the decoupling of the two previously connected physical coupling modules owing to magnetic repulsive forces, and which then further operates to prevent the two selected physical coupling modules from re-connecting as long as the repulsive alignment of the magnets is maintained by the two respective electromagnet modules. This provides a means for the solar collector pods to be automatically separated from one another and to prevent reattachment or the reestablishment of an electrical contact between the pods, assisting in their removal from the body of water for storage or transport when desired. In a related embodiment, the electronic control module can monitor the status of the floating solar collector pod and, if an anomaly or defect is detected, can then detach itself from the array by activating the appropriate electromagnets in order to decouple itself from other adjacent pods, and maintain itself in a detached and non re-attachable configuration until the damaged pod is physically removed from the matrix or displaced from the matrix.

Figure 11:
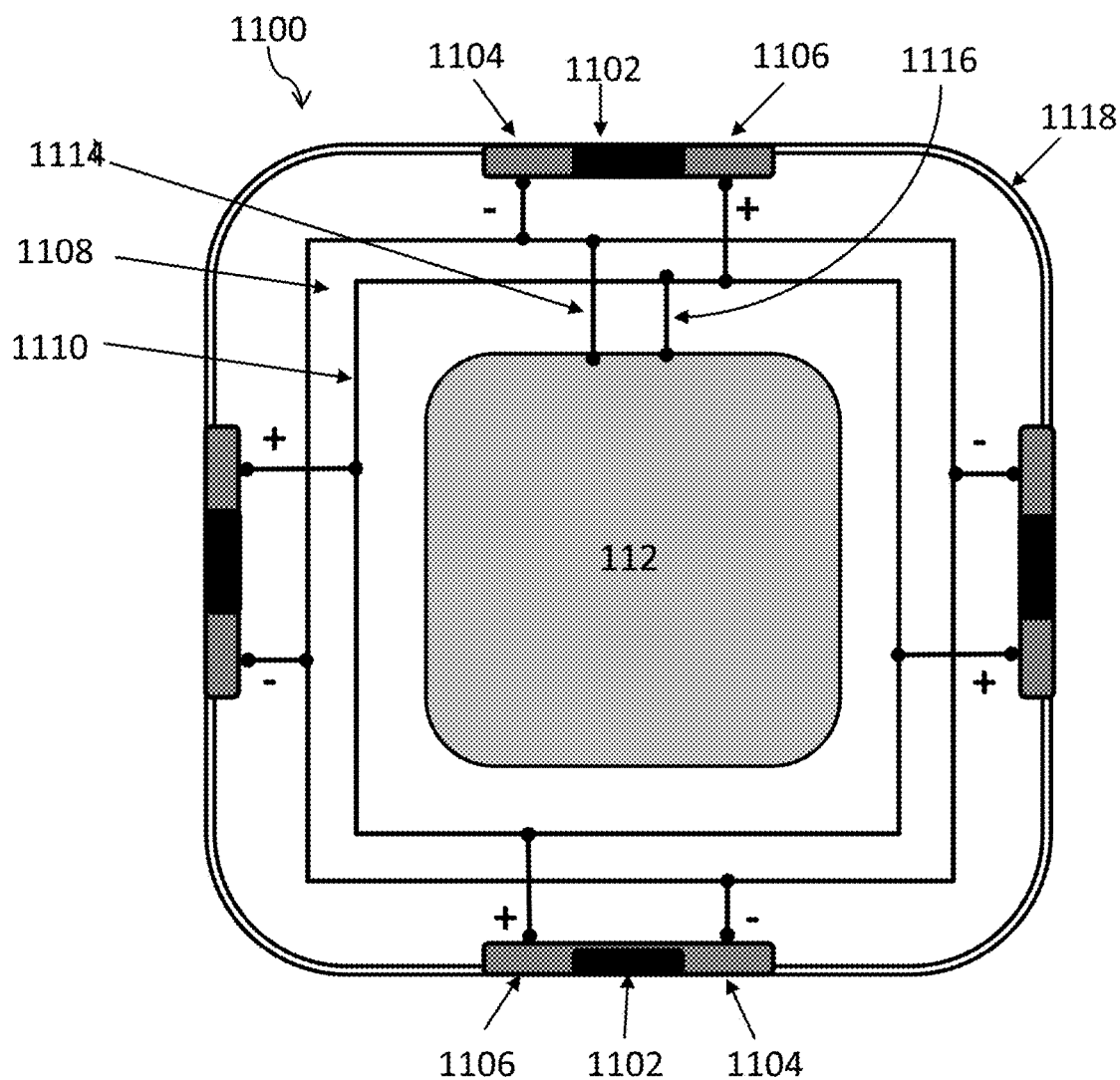
FIG. 11 illustrates an embodiment of a floating accessory pod as may be used to effect certain of the embodiments described herein.

FIG. 11 illustrates an embodiment of a floating accessory pod 1100 as may be used to effect certain of the embodiments described herein. The accessory pod 1100 has a coupling connector on each side. While FIG. 11 shows a four-sided pod, this disclosure should not be limited to four sides. For example and without limitation, a six-sided or three-sided pod may provide for greater operability and stability. Each coupling connector includes a magnetic connector element 1102, a negative connector element 1104 and a positive connector element 1106 (collectively a coupling module). In certain embodiments the coupling modules are gimbaled to allow for swiveling of the coupling module in the event of movement between the accessory pod 1100 and any other device coupled to the coupling module.

The coupling modules are electrically coupled in parallel using current loops 1108 and 1110. The current loops 1108 and 1110 are coupled to an accessory module 1112. The coupling modules are all connected in parallel. The Outer Perimeter ring 1118 provides structure and stability. While FIG. 11 shows four coupling connectors, there is no requirement that there be exactly four coupling connectors. For example and without limitation, a six-sided floating pod may provide more stability when formed into an array with other pods. Also, the pods may not have coupling connectors on each side; a three-sided pod may have one, two or three coupling connectors.

In operation, the embodiment of FIG. 11 shows the accessory module 1112 as being electrically connected to connector element 1102. Since all connector elements are connected in series, power entering the floating accessory pod at any connector element will be also coupled to the accessory module 1112 and to all the other connector elements. Thus the accessory pod 1100 provides both a path to power the accessory 1112 and a path to power other devices coupled to the other coupling modules. Power sourced through the connector element 1102 is available for the accessory to consume in operation.

Figure 12:
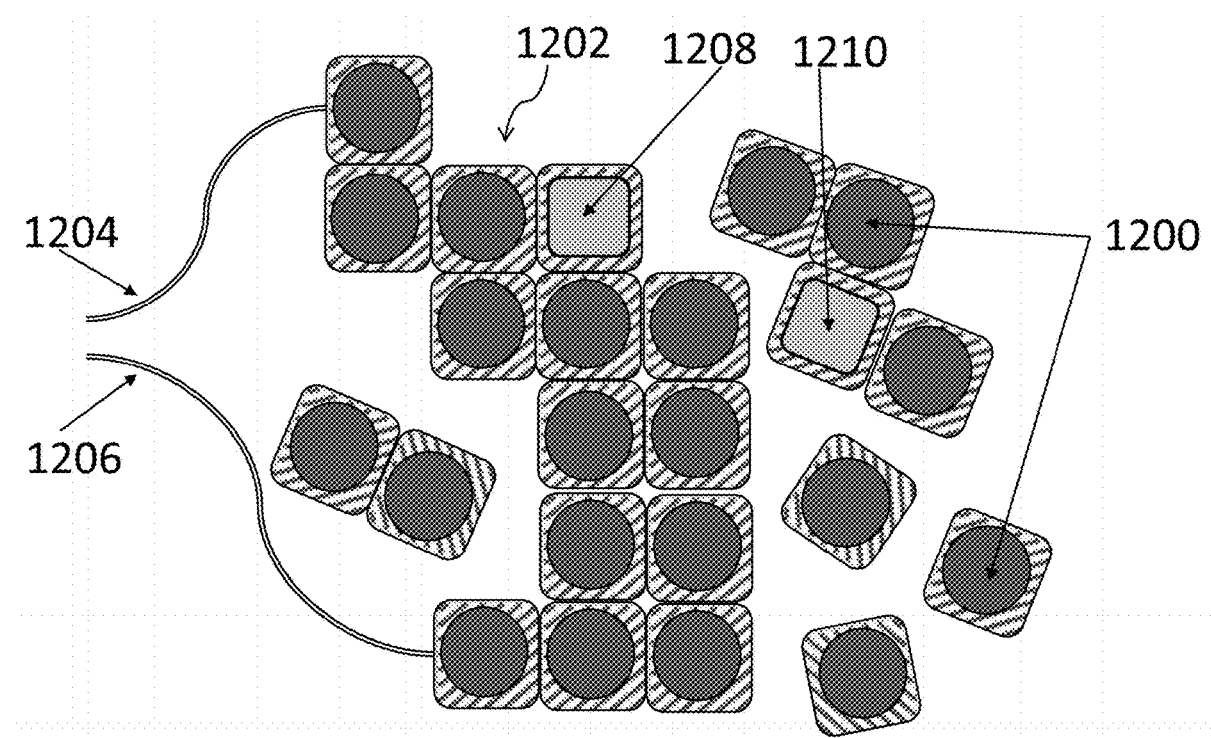
FIG. 12 illustrates an exemplary floating accessory pod collection coupled to solar collector pods.

FIG. 12 illustrates an exemplary floating accessory pod collection coupled to solar collector pods. In FIG. 12 accessory pods 1208 and 1210 are floating on a liquid surface. Coupled to those accessory pods 1208 and 1210 are solar collector pods 1200. The solar collector pods 1200 have one or more solar collector cells coupled to a floating structure similar to that show in FIG. 11. The solar pods also have coupling modules for directing power off the solar pod and for providing a path for power to flow across the solar pod to other coupling modules. Some of the solar collector pods 1200 may be formed into an array 1202. The array 1202 provides for electrical contact between the solar collector pods 1200 and accessory pods 1208. In addition, the array provides for increased power by sourcing power from each of the solar collector pods 1200 in the array 1202. Further coupled to the array 1202 are conduits 1204 and 1206 for taking power off the array to another location such as a power inverter or storage facility. As shown, there is a negative collection conduit 1204 and a positive collection conduit 1206 for taking different polarity power off the array 1202. However, a single conduit for taking both positive and negative polarity power off the array 1202 may also be employed.

In operation an accessory pod 1208 is coupled to either a solar collector pod 1200 or a pod array 1202. Power is receive by the accessory pod 1208 through the coupling mechanisms as described herein. These accessory pods 1208 and 1210 may include stills, chlorinators and other type of accessories as disclosed herein.

Figure 13:
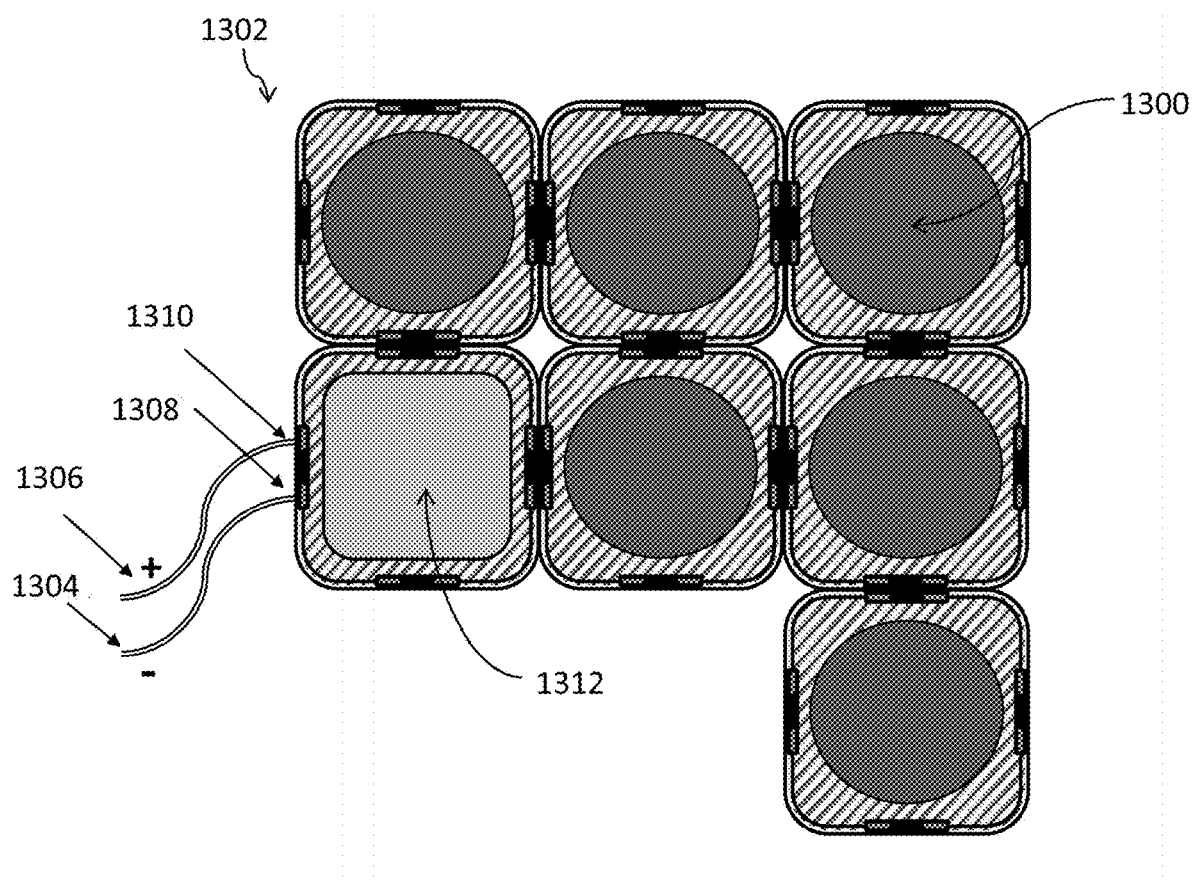
FIG. 13 shows an alternative view of a solar collector pod array.

FIG. 13 shows an alternative view of a solar collector pod array 1302. The pod array 1302 includes six solar collector pods 1300 coupled to an accessory pod 1312. In FIG. 13, the accessory pod 1312 is a power distribution module. The power distribution module operates to collect power from the solar array 1302 and distribute it to another location by providing a positive and negative collection conduit 1302 and 1304. In some embodiments the power distribution module 1312 may include a power inverter for converting DC current supplied from the solar array 1302 to alternating current for transmission our the collection conduits 1304 and 1306.

Figure 14:
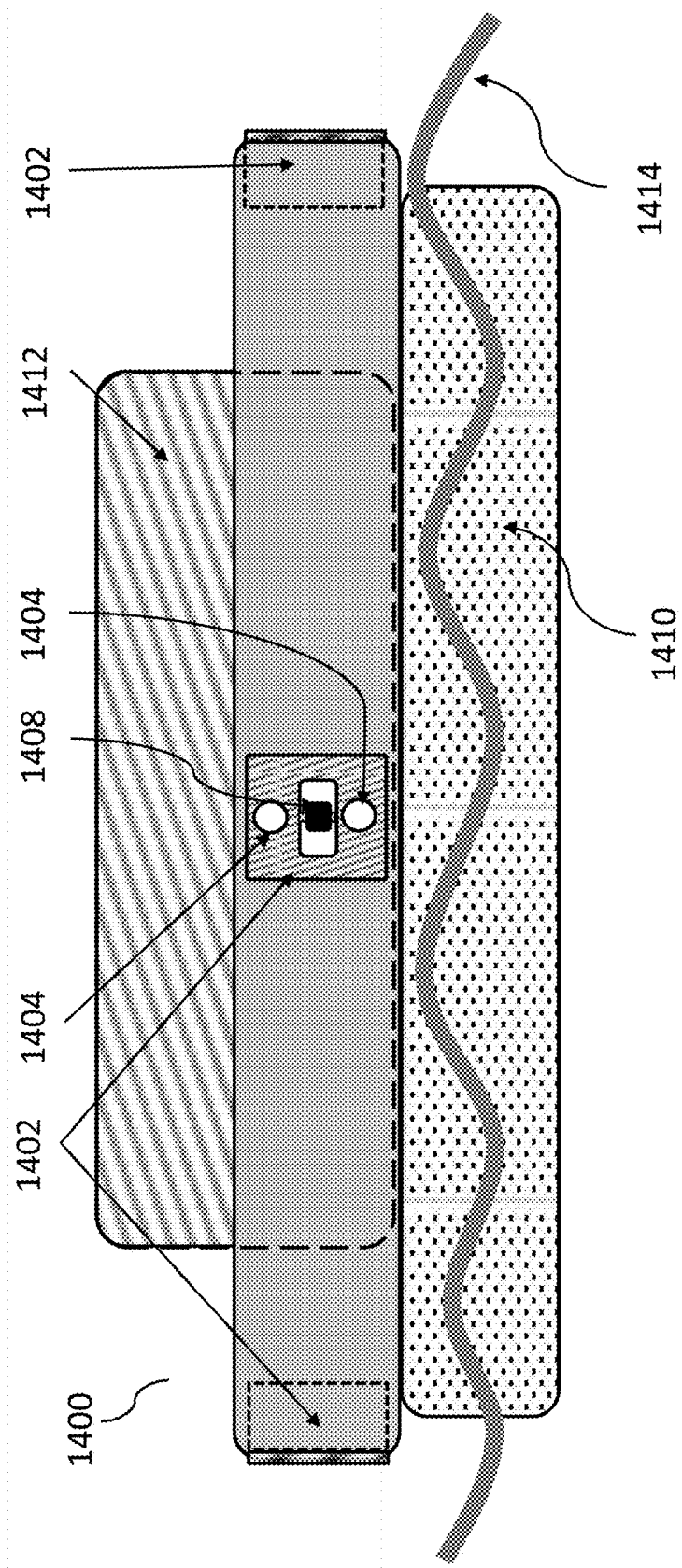
FIG. 14 shows a side detail view of an embodiment of an accessory pod according to the present disclosure.

FIG. 14 shows a side detail view of an embodiment of an accessory pod 1400 according to the present disclosure. In FIG. 14 the accessory pod 1400 features a similar outer dimension, shape and configuration, with respect to its outer perimeter and 'footprint', as those disclosed floating solar collector pods as described herein, and shows the automatically engaging magnetic and electrical coupling modules 1402 that enables reversible attachment and electrical communication between adjacent floating solar collector pods. FIG. 14 also shows some floatation means 1410 enabling the accessory unit to float on or near the surface of the water (as denoted by representative water line 1414) by providing a structure with sufficient buoyancy to hold the accessory module 1412 at or above the surface of the liquid. This structure may be formed from low-density plastic, inflatable air ballasts, Styrofoam and the like.

In this example embodiment, the accessory unit 1400 supports an accessory module 1412 as described herein, that performs one or more additional functions while associated with or attached to one or a plurality of floating solar collector panels or an array thereof. In this example of a square shaped accessory pod 1400 features four magnetic/electric coupling modules 1402 that are centered on each of the four sides (faces) of the pod perimeter coupling ring 1401, which operates to support the center positioned accessory module 1412. Each of the four magnetic/electric coupling modules 1402 feature a gimbaled magnetic connection component 1408 that operates to align, attract and then magnetically couple to a second adjacent gimbaled magnetic connection component 1408 (not shown) located on another solar collection pod or another accessory pod. In certain embodiments the magnet is position to swivel and thus expose the appropriate mating polarity with an approaching magnet.

In operation, when adjacent gimbaled magnetic connection components 1408 are magnetically coupled, the strong attractive magnetic force results in their establishing a close physical or electromagnetic contact between the corresponding magnetic/electric coupling modules 1402, bringing the respective first (negative) electrode 1404 into electrically conductive contact with the corresponding negative electrode (not shown) located on the adjacent pod, and also simultaneously bringing the respective second (positive) electrode 1406 into electrically conductive contact with the corresponding positive electrode (not shown) located on the adjacent pod, thus establishing an electrical connection and a circuit between the accessory pod 1400 and a second accessory pod or solar collection pod. In this particular embodiment, the floatation (buoyancy) means 1410 can be selected as to size, shape, density and material so as to be compatible with water or other liquid and to float the assembled accessory pod in the selected body of liquid with a particular density, so that the magnetic/electric coupling modules 1402 are maintained substantially above the nominal level of the water or water line 1414 as shown in FIG. 14. The coupling modules 1402 are formed with a degree of "play" or looseness so that they remain coupled in the event of movement between an accessory pod 1400 and an adjacent coupled accessory pod (not shown).

In other embodiments of this disclosure, the accessory pod 1400 may host one or more accessory modules 1412 that perform one or more functions. In yet another embodiment of this disclosure, the one or more accessory modules 1412 are connected to the positive and negative electrode circuit bus (not shown) that connects all the negative and all the positive electrodes and their conductive coupling components, respectively, enabling the accessory module 1412 to use power from the circuit bus when powered, to receive signals transmitted across the circuit bus (and when attached into an array, signals transmitted across the connected array of a plurality of collective solar collection pods and accessory units. Conversely, the one or more accessory modules 1412 associated with a particular accessory unit 1400 can also transmit or inject signals into the circuit bus (and when attached into an array, transmit signals transmitted across the connected array of a plurality of collective solar collection pods and accessory units. Such signals may include, but are not limited to, current pulses, voltage pulses, encoded data pulses of selected current, voltage and/or frequency, modulated.

In other embodiments of the disclosure, an accessory module such as that represented in FIG. 14, may extend into the water or have some communication means to enable it to sample an aliquot or a flowing stream or volume of water from the floating body of water upon which it is situated, and may also have means to allow tested or treated water to be returned to the body of water. In further related embodiments of the disclosure, the floatation (buoyancy) means as illustrated in FIG. 14 may be configured to have one or more open, inner volumes or spaces in order to accommodate components of an associated accessory module that need to be placed on or below the surface of the water, such as for example, but not limited to, accessory modules that have motive means such as motors, propellers, fins, steering devices, sampling tubes for water, and the like. In one example embodiment, the floatation means 1410 is configured in the shape of a torus (donut) wherein the center hole is of sufficient dimensions (diameter and cross-sectional thickness) to accommodate a selected accessory module 1412 or components thereof that extend downward towards the water line 1414. In related embodiments, the floatation means 1410 is selected to have an outer dimension that is equal to or less than the outer dimension of the pod perimeter coupling ring 1401 so as not to interfere with the automatic magnetic coupling process that occurs when two adjacent pods are attracted towards each other under magnetic force of attraction between their two respective gimbaled magnetic connection components 1408 and then couple to form an electrical connection when the respective first (negative) and second (positive) sets of electrodes (1404, 1406) are brought into conductive contact.

Figure 15:
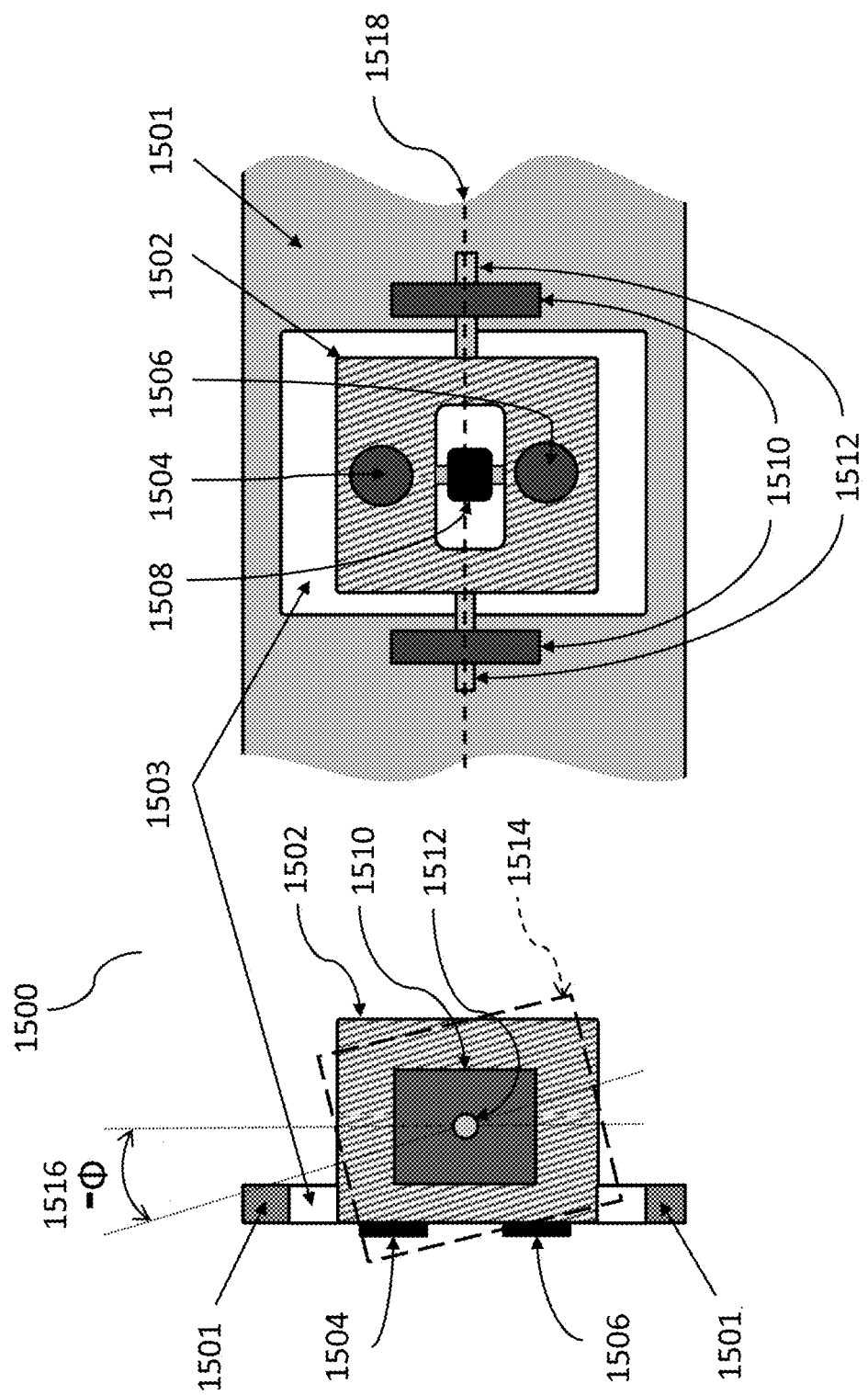
FIG. 15 shows several diagrammatic views of one example embodiment of the present disclosure detailing a pivoting gimbaled magnetic/electric coupling module

FIG. 15 shows several diagrammatic views of one example embodiment of the present disclosure detailing a pivoting gimbaled magnetic/electric coupling module 1500 as described herein that features a pivot system enabling the gimbaled magnetic/electric coupling module 1502 to pivot up and down (with respect to drawing orientation, or perpendicular with respect to a normal axis right angle to the surface plane of the pod perimeter coupling rail 1501) through an angle of between $-\Phi$ and $+\Phi$, or a total rotational span equivalent to an angle of $2\Phi$ about a pivot axis 1518 corresponding to a common axis shared by one or more pivot rods 1512 that connect the module 1500 to one or more pivot joint support blocks 1510. In this example embodiment, two or more pivot joint support blocks 1510 may be formed into, connected to, mounted on, or located on the inner side of the pod perimeter coupling rail 1501, such that the one or more pivot rods 1512 are axially aligned and coincident to the pivot axis 1518, and supported by the pivot joint support blocks 1510 and are free to rotate about their axis, corresponding to the pivot axis 1518.

In a further related embodiment, some tensioning means including a spring, frictional member, screw tensioner, and the like, and combinations thereof, may optionally be employed to tension the one or more pivot rods 1512 rather than the gimbaled magnetic/electric coupling module 1502 directly, in order to bias the module 1502 into a neutral position or angle when it is an unattached or uncoupled state, and/or to prevent rapid movement or oscillation of the modules 1502 when unattached or uncoupled and subject to wave motion, vibration or shaking as a result of the motion of the floating solar collection pod or accessory pod upon the surface of the body of water. Tensioning of moveable coupling units may be preferable in order to reduce unnecessary motion, tension and stress on moving parts, preserving physically and electrical coupling capability between adjacent pods and their respective plurality of pivoting gimbaled magnetic/electric coupling modules.

In the embodiment of FIG. 15, to provide clearance for the pivot motion of the gimbaled magnetic/electric coupling module 1502, particularly the top and bottom (with respect to drawing orientation) of said module, a clearance hole 1503, being an open space or bored out opening in the pod perimeter coupling rail 1501 is provided, with top and bottom clearance for the top and bottom outside leading edges of the pivoting coupling 1502 being indicated by the dashed outline 1514 in the left side schematic of FIG. 15 corresponding to the outline of the coupling module 1502 in a tilted position in which it is pivoted downward at an angle of $-\Phi$ (the outside facing first and second electrode detail (1504, 1506) not shown.

In operation, the gimbaled magnetic/electric coupling module 1502 is normally located in a neutral or non-pivoted position, corresponding to an angle $\Phi$ of about zero (0) degrees, and may optionally be torsionally or otherwise biased so as to maintain this neutral orientation in the absence of any external force or movement of the pod or rail to which the coupling 1502 is mounted. Then, as an adjacent floating solar collection pod or accessory pod bearing a corresponding gimbaled magnetic/electric coupling module 1502 on its pod perimeter coupling rail 1501 approaches one another, the gimbaled magnets 1508 of each corresponding gimbaled magnetic/electric coupling module 1502 automatically re-align their relative N (north) and S (south) magnetic poles in order to form an attractive N-S (or S-N) orientation, enabling the two corresponding gimbaled magnets 1508 to strongly attract one another, resulting in the modules being drawn together, and thus drawing together the attached coupling ring and corresponding pod into close physical contact by means of the magnets, and simultaneously bringing each of the set of the negative electrodes (1504) and the set of positive electrodes (1506) on the corresponding coupling modules 1502 into close physical and electrically conductive contact. Typically, this would occur without the need for a pivoting mechanism, but it may be highly advantageous to provide a pivoting means to accommodate slight misalignment in the relative positions of two or more gimbaled magnetic/electric coupling modules 1502 during the magnetic coupling step during self-assembly of floating pods or accessory pods on the water surface. Further, this improvement is highly advantageous to provide a range of motion ($2\Phi$) through which free and interconnected coupling modules 1502 may move, particularly in the latter instance when two or more coupling modules 1502 are coupled and the correspondingly coupled solar collection pods or accessory pods are floating on the surface of water where ripples, variations in water height, waves and other variations in relative position and displacement are actively occurring between the respective pods as a result of waves, water currents, the wind and other disturbances to the floating connected array.

In a related embodiment, the pivoting mechanism including the pivot joint support block(s) 1510 and pivot rod(s) 1512 may be replaced by any other suitable means capable of holding the gimbaled magnetic/electric coupling module 1502 in a moveable, but torsionally biased neutral position, such as for example including, but not limited to, pivoting means selected from a spring coupling, tensioned filament, flexible mount, pivoting connector, "lazy-susan" pivoting ring, one or plurality thereof, and combinations thereof.

In a further related embodiment, the conductive wire connectors (not shown) that attach to the first and second electrodes (504, 1506) may be tensioned so as to provide a torsionally biased neutral position to said gimbaled magnetic/electric coupling module 1502, the tensioned wire connectors having sufficient flexibility or movement so as to enable them to bend and move with the module 1502 throughout its maximum pivoting range or angle of $2\Phi$, when two modules 1502 are physically and electrically coupled between adjacent floating solar collection pods and/or accessory pods, and subject to a range of relative positions due to the movement of the array of pods on the surface of a body of water.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

We claim:

1. A device comprising:
   a radiant energy convertor;
   a flotation module operable to dispose the radiant energy convertor in a first direction;
   a plurality of magnetic connector elements disposed near one or a plurality of sides of the flotation module and each electrically coupled to the radiant energy convertor;
   wherein said magnetic connector element is gimbaled with respect to the flotation module to provide either translational or rotational movement;
   wherein said magnetic connector elements operate to magnetically attract and physically couple one or a plurality of adjacent flotation modules;
   wherein said magnetic connector element has a first set of electrodes and a magnet disposed near said first set of electrodes that operates to connect to an adjacent magnetic connector element located on a second adjacent flotation module when at least two magnetic connector elements are located in proximity to one another;
   wherein said adjacent magnetic connector element has at least one second set or a plurality of sets of electrodes and a magnet disposed near each of said electrodes that operates to attract said first and at least one of said second adjacent magnetic connector elements into physical contact thereby operating to connect said first set of electrodes to at least one of said second set of electrodes.

2. The device of claim 1 wherein said plurality of sets of electrodes have at least one high voltage potential electrode and one low voltage potential electrode suitable for transmitting alternative current or voltage.

3. The device of claim 2 further comprising a positive or high voltage potential current loop operable to electrically connect all of said positive electrodes and a negative or low voltage potential current loop operable to electrically connect all of said negative electrodes.

4. The device of claim 1 wherein said floatation module operates to maintain said plurality of magnetic connector elements above the surface of a body of water.

5. The device of claim 1 wherein the outer perimeter of said floatation module comprises a geometric shape having a number of sides selected from four, five, six, seven or eight, and combinations thereof;
   wherein said sides on any selected floatation module are equivalent in dimension so that said floatation module is rotationally symmetric about a center axis.

6. An array of devices comprising two or more of said devices according to claim 1 interconnected with each other by means of at least two or a plurality of the magnetic connector elements forming a magnetic contact between adjacent devices.

7. The array of devices according to claim 6, wherein said array comprises two or more of said devices that are magnetically interconnected and that operate to interconnect said plurality of sets of electrodes so that each of said devices of said array are all in electrical communication with each other.

8. An array of devices according to claim 7 wherein a plurality of floatation modules of selected geometric shapes operate to fit together in a close tiling arrangement when disposed on the surface of a body of water and attracted to each other by means of one or a plurality of magnetic coupling elements.

9. The device of claim 1, wherein said floatation module and radiant energy convertor are connected by means of a pod perimeter coupling rail;
   wherein said pod perimeter coupling rail supports each of said plurality of magnetic coupling elements.

10. The device of claim 9, wherein each of said magnetic coupling elements are disposed on an outer face of said pod perimeter coupling rail;
    wherein said magnetic coupling elements are positioned in a perpendicular position to said first position; and
    wherein each of said magnetic coupling elements are positioned approximately near the center of each outer face of said pod perimeter coupling rail.

* * * * *